(12) United States Patent
Pant et al.

(10) Patent No.: US 12,341,497 B2
(45) Date of Patent: Jun. 24, 2025

(54) POWER MULTIPLEXER

(71) Applicant: QUALCOMM Incorporated, San Diego, CA (US)

(72) Inventors: Harshat Pant, San Diego, CA (US); Hanil Lee, San Diego, CA (US); Shih-Hsin Jason Hu, San Diego, CA (US); Chulmin Jung, San Diego, CA (US); Xiao Chen, San Diego, CA (US); Christol Barnes, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 167 days.

(21) Appl. No.: 18/340,449

(22) Filed: Jun. 23, 2023

(65) Prior Publication Data
US 2024/0429908 A1    Dec. 26, 2024

(51) Int. Cl.
*H03K 17/00* (2006.01)
*G05F 1/46* (2006.01)
*H03K 5/24* (2006.01)

(52) U.S. Cl.
CPC .......... *H03K 17/002* (2013.01); *G05F 1/46* (2013.01); *H03K 5/24* (2013.01)

(58) Field of Classification Search
CPC .... H03K 17/005; H03K 3/012; H03K 17/002; H03K 19/0016; H03K 5/24; G05F 1/46; G06F 1/28; G06F 1/324; G06F 1/263; G06F 1/26; G06F 1/3296; G06F 1/305
See application file for complete search history.

(56) References Cited

U.S. PATENT DOCUMENTS

| | | | |
|---|---|---|---|
| 5,886,424 A | 3/1999 | Kim | |
| 8,015,419 B2 | 9/2011 | Rowhani et al. | |
| 8,058,911 B1 | 11/2011 | Wright | |
| 8,125,501 B2 | 2/2012 | Amundson et al. | |
| 8,791,692 B2 * | 7/2014 | Furukawa | G01D 5/147 324/207.21 |

(Continued)

FOREIGN PATENT DOCUMENTS

| | | |
|---|---|---|
| CN | 104052295 A | 9/2014 |
| CN | 105528051 A | 4/2016 |

(Continued)

OTHER PUBLICATIONS

International Search Report and Written Opinion—PCT/US2024/027643—ISA/EPO—Jul. 30, 2024.

*Primary Examiner* — Quan Tra
(74) *Attorney, Agent, or Firm* — Loza & Loza, LLP

(57) ABSTRACT

A system includes a comparator having a first input, a second input, and an output. The system also includes a first voltage divider having an input and an output, wherein the input of the first voltage divider is coupled to a first power rail, and the output of the first voltage divider is coupled to the first input of the comparator. The system also includes a second voltage divider having an input and an output, wherein the input of the second voltage divider is coupled to a second power rail, and the output of the second voltage divider is coupled to the second input of the comparator. The system further includes a power multiplexer coupled to the first power rail, the second power rail, and a first circuit, and a control circuit coupled to the output of the comparator and the power multiplexer.

26 Claims, 15 Drawing Sheets

(56) References Cited

U.S. PATENT DOCUMENTS

| | | |
|---|---|---|
| 8,896,147 B2 | 11/2014 | Mangattur et al. |
| 9,685,940 B2 | 6/2017 | Vilangudipitchai et al. |
| 9,811,062 B2 * | 11/2017 | Akebono .................. H03J 9/00 |
| 10,243,749 B2 * | 3/2019 | Park ......................... G09C 1/00 |
| 10,317,968 B2 | 6/2019 | Pant et al. |
| 11,119,523 B2 * | 9/2021 | Wu ....................... G11C 29/028 |
| 2005/0060587 A1 * | 3/2005 | Hwang ..................... G06F 1/28 |
| | | 713/300 |
| 2009/0167410 A1 * | 7/2009 | Yoshikawa .......... H03K 17/693 |
| | | 327/427 |
| 2010/0164292 A1 | 7/2010 | Freeman et al. |
| 2011/0018347 A1 | 1/2011 | Noda |
| 2012/0320632 A1 | 12/2012 | Kalodka et al. |
| 2013/0293013 A1 | 11/2013 | Templeton et al. |
| 2013/0313904 A1 | 11/2013 | Kayama |
| 2013/0332748 A1 | 12/2013 | Kolla et al. |
| 2014/0285014 A1 | 9/2014 | Calhoun et al. |
| 2015/0002179 A1 * | 1/2015 | Akebono ......... G01R 19/16538 |
| | | 324/713 |
| 2015/0200541 A1 | 7/2015 | Gorla et al. |
| 2016/0109932 A1 | 4/2016 | Jeon |
| 2016/0134159 A1 * | 5/2016 | Umeyama .............. H03K 3/012 |
| | | 307/64 |
| 2016/0308372 A1 | 10/2016 | Kolla et al. |
| 2018/0006491 A1 * | 1/2018 | Yasukawa ................. H02J 1/10 |

FOREIGN PATENT DOCUMENTS

| | | |
|---|---|---|
| JP | 2014230350 A | 12/2014 |
| KR | 20100124321 A | 11/2010 |
| KR | 20130133137 A | 12/2013 |
| KR | 20160046145 A | 4/2016 |
| WO | 2016137605 | 9/2016 |
| WO | 2016168695 A1 | 10/2016 |
| WO | 2017019160 | 2/2017 |

* cited by examiner

POWER MULTIPLEXER

BACKGROUND

Field

Aspects of the present disclosure relate generally to power management, and, more particularly, to power multiplexers.

Background

A system (e.g., system on a chip (SoC)) may include a circuit and a power multiplexer coupled between the circuit and two or more power rails (also referred to as supply rails). The power multiplexer may be configured to switch the circuit between the two or more power rails. The two or more power rails may have different supply voltages, allowing the power multiplexer to switch the circuit between the different supply voltages.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a comparator having a first input, a second input, and an output. The system also includes a first voltage divider having an input and an output, wherein the input of the first voltage divider is coupled to a first power rail, and the output of the first voltage divider is coupled to the first input of the comparator. The system also includes a second voltage divider having an input and an output, wherein the input of the second voltage divider is coupled to a second power rail, and the output of the second voltage divider is coupled to the second input of the comparator. The system further includes a power multiplexer coupled to the first power rail, the second power rail, and a first circuit, and a control circuit coupled to the output of the comparator and the power multiplexer.

A second aspect relates to a method for multiplexing a circuit between a first power rail having a first supply voltage and a second power rail having a second supply voltage. The method includes determining a transition of the first supply voltage, comparing a voltage level of the first supply voltage with a compare voltage level during the transition using a comparator, the compare voltage including a voltage level of the second supply voltage and a comparator offset, detecting a change in an output of the comparator during the transition, and, after detecting the change in the output of the comparator, switching the circuit between the first power rail and the second power rail.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
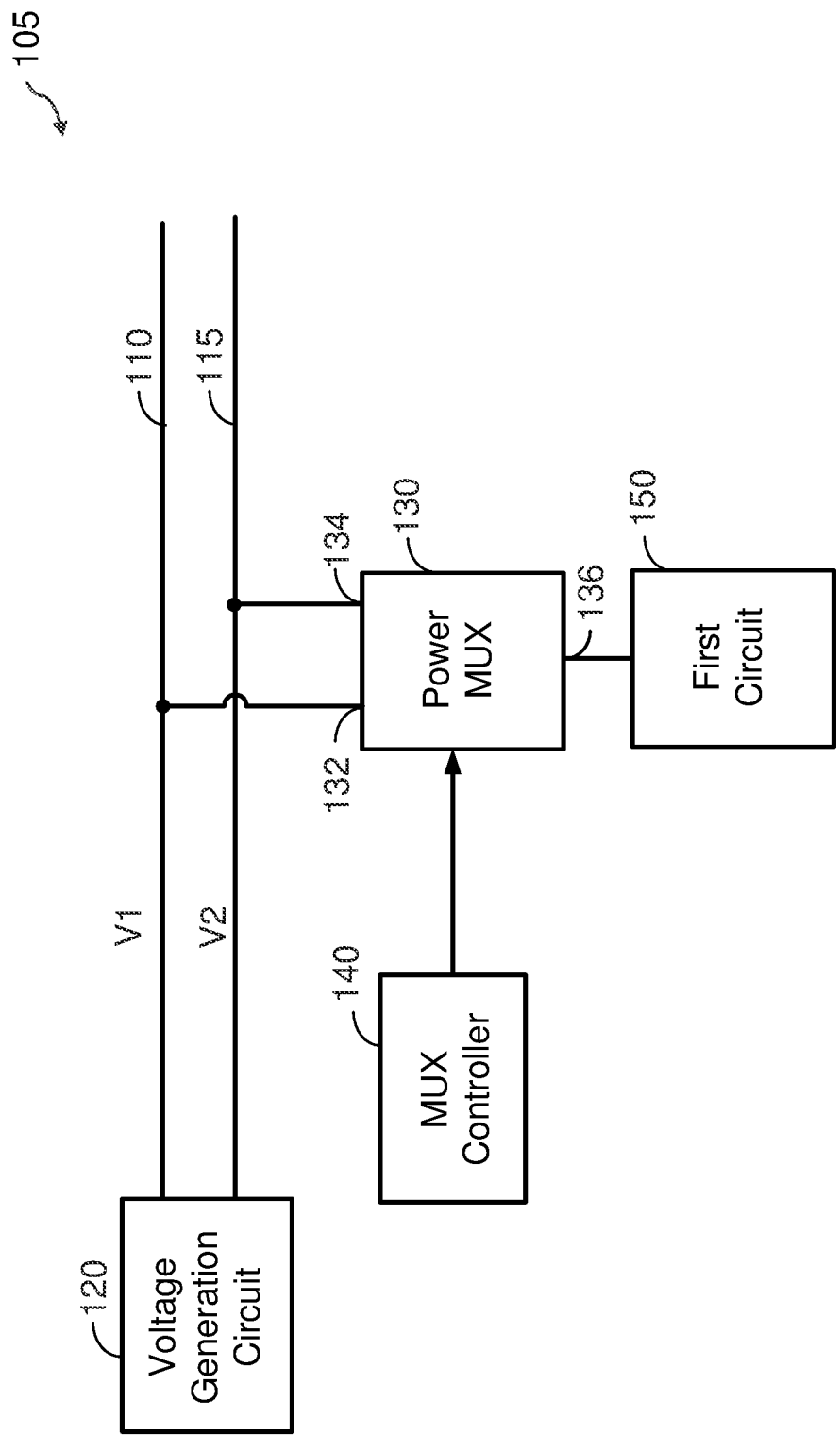
FIG. 1 shows an example of a system including a first circuit and a power multiplexer according to certain aspects of the present disclosure.

FIG. 1 shows an example of a system 105 according to certain aspects. The system 105 includes a voltage generator 120, a power multiplexer 130, a multiplexer controller 140, and a first circuit 150. The voltage generator 120 is configured to generate a first supply voltage (labeled "V1") and a second supply voltage (labeled "V2"). For example, the voltage generator 120 may generate the first supply voltage and the second supply voltage from the voltage of a power source (e.g., a battery) using voltage converters (e.g., switching regulators, linear regulators, or any combination thereof). The voltage generator 120 may be implemented in a power management integrated circuit (PMIC).

In certain aspects, the voltage generator 120 provides the first supply voltage to a first power rail 110 coupled to the voltage generator 120, and provides the second supply voltage to a second power rail 115 coupled to the voltage generator 120. The first supply voltage and the second supply voltage may have different voltage levels. In certain aspects, the voltage level of the first supply voltage and the voltage level of the second supply voltage are programmable (e.g., to support dynamic voltage scaling), as discussed further below. It is to be appreciated that a power rail may also be referred to as a supply rail or another term.

The power multiplexer 130 has a first terminal 132, a second terminal 134, and a third terminal 136. The first terminal 132 is coupled to the first power rail 110, the second terminal 134 is coupled to the second power rail 115, and the third terminal 136 is coupled to the first circuit 150. The power multiplexer 130 is configured to selectively couple the first circuit 150 to the first power rail 110 or the second power rail 115 under the control of the multiplexer controller 140. This allows the multiplexer controller 140 to switch the first circuit 150 between the first power rail 110 and the second power rail 115 (and hence switch the first circuit 150 between the first supply voltage and the second supply voltage) using the power multiplexer 130. For example, the multiplexer controller 140 may switch the first circuit 150 between the first power rail 110 and the second power rail 115 based on one or more parameters. The one or more parameters may include the voltage level of the first supply voltage, the voltage level of the second supply voltage, a transition of the first supply voltage or the second supply voltage from one voltage level to another voltage level, a threshold voltage level, or any combination thereof. Examples of the parameters are discussed further below.

The power multiplexer 130, the first circuit 150, and the multiplexer controller 140 may be integrated on a chip (e.g., integrated in a system on a chip (SoC)). The voltage generator 120 may also be integrated on the chip or may be external to the chip (i.e., located off chip). Although one power multiplexer 130 is shown in FIG. 1 for ease of illustration, it is to be appreciated that the system 105 may include multiple power multiplexers (e.g., distributed at different locations in the system 105).

Figure 2:
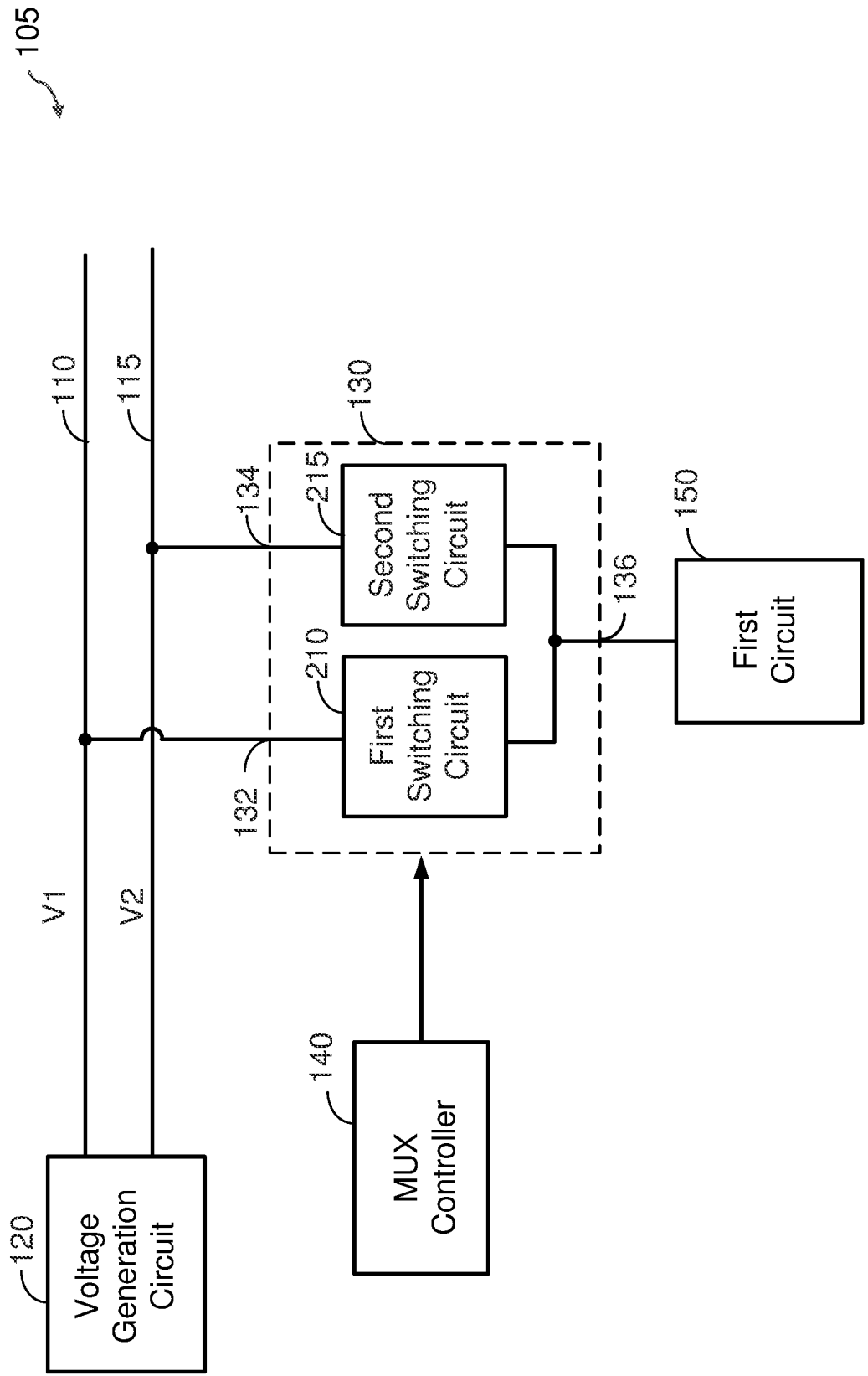
FIG. 2 shows an exemplary implementation of the power multiplexer of FIG. 1 according to certain aspects of the present disclosure.

FIG. 2 shows an exemplary implementation of the power multiplexer 130 according to certain aspects. In this example, the power multiplexer 130 includes a first switching circuit 210 and a second switching circuit 215. The first switching circuit 210 is coupled between the first terminal 132 and the third terminal 136. The first switching circuit 210 is configured to couple the first terminal 132 to the third terminal 136 in an on state (i.e., closed state) and decouple the first terminal 132 from the third terminal 136 in an off state (i.e., open state). The second switching circuit 215 is coupled between the second terminal 134 and the third terminal 136. The second switching circuit 215 is configured to couple the second terminal 134 to the third terminal 136 in an on state (i.e., closed state) and decouple the second terminal 134 from the third terminal 136 in an off state (i.e., open state).

In this example, the multiplexer controller 140 is configured to control which one of the power rails 110 and 115 is coupled to the first circuit 150 by controlling the on/off states of the switching circuits 210 and 215 in the power multiplexer 130. For example, to select the first power rail 110, the multiplexer controller 140 turns on the first switching circuit 210 and turns off the second switching circuit 215. In this case, the first power rail 110 is coupled to the first circuit 150 through the first switching circuit 210. To select the second power rail 115, the multiplexer controller 140 turns off the first switching circuit 210 and turns on the second switching circuit 215. In this case, the second power rail 115 is coupled to the first circuit 150 through the second switching circuit 215.

Each of the switching circuits 210 and 215 may include one or more switches (e.g., head switches), in which each switch may be implemented with a transistor or another type of switch. For the example of a switch implemented with a transistor, the multiplexer controller 140 may control the on/off state of the switch by controlling the voltage at the gate of the transistor. For example, for a switch implemented with one or more p-type field effect transistors (PFETs), the controller 140 may turn on the switch by applying a low voltage (e.g., ground potential) to the gates of the one or more PFETs, and turn off the switch by applying a high voltage (e.g., the first supply voltage, the second supply voltage, or another supply voltage) to the gates of the one or more PFETs.

Figure 3:
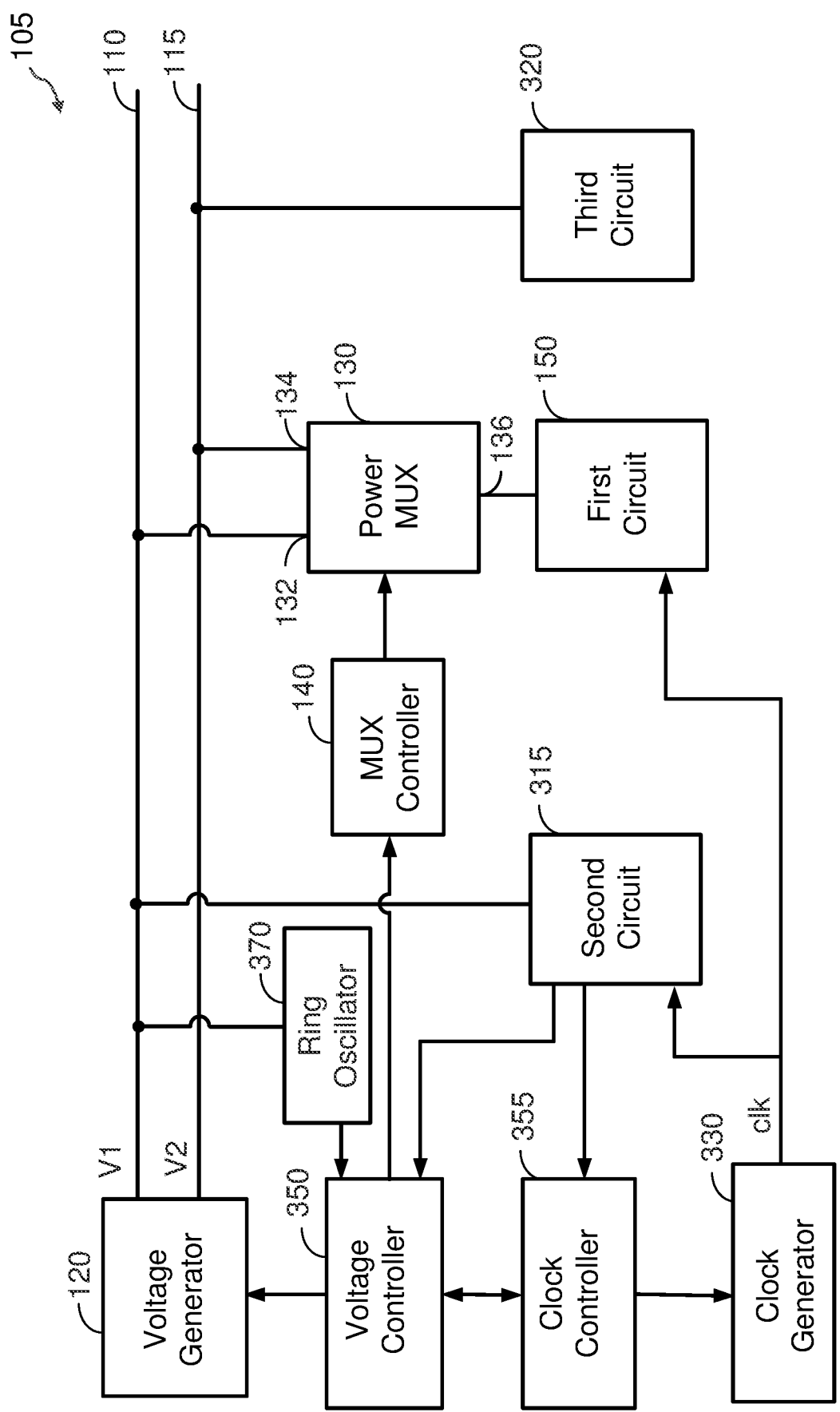
FIG. 3 shows an example of the system further including a second circuit and a third circuit according to certain aspects of the present disclosure.

FIG. 3 shows an example in which the system 105 further includes a second circuit 315 and a third circuit 320. The second circuit 315 is coupled to the first power rail 110 and the third circuit 320 is coupled to the second power rail 115. Thus, in this example, the second circuit 315 receives the first supply voltage (labeled "V1") and the third circuit 320 receives the second supply voltage (labeled "V2"). In certain aspects, the first circuit 150, the second circuit 315, and the third circuit 320 are integrated in the SoC discussed above.

In the example in FIG. 3, the system 105 also includes a voltage controller 350, a clock generator 330, and a clock controller 355. The voltage controller 350 is coupled to the voltage generator 120, and is configured to set (i.e., program) the voltage level of the first supply voltage and the voltage level of the second supply voltage generated by the voltage generator 120. For example, the voltage controller 350 may be configured to set the voltage level of the first supply voltage based on a performance mode of the second circuit 315 and/or another parameter, as discussed further below. The voltage controller 350 may also be configured to set the voltage level of the second supply voltage based on a performance mode of the third circuit 320 and/or another parameter.

In certain aspects, the voltage controller 350 may independently set the voltage levels of the first supply voltage and second supply voltage. This allows the second circuit 315 and the third circuit 320 to operate in different voltage domains (also referred to as power domains) for improved power efficiency. For example, when the second circuit 315 operates in a high performance mode requiring a higher voltage level than the third circuit 320, the voltage controller 350 may set the first supply voltage to a higher voltage level than the second supply voltage. This improves power efficiency by allowing the third circuit 320 to operate at a lower voltage level than the second circuit 315, which reduces the power consumption of the third circuit 320. In another example, when the second circuit 315 operates in a low performance mode, the voltage controller 350 may set the first supply voltage to a lower voltage level than the second supply voltage. This conserves power by allowing the second circuit 315 to operate at a lower voltage level than the third circuit 320.

In the example in FIG. 3, the clock generator 330 is coupled to the second circuit 315 and the first circuit 150. The clock generator 330 is configured to generate a clock signal (labeled "clk") and output the clock signal to the second circuit 315 and the first circuit 150 to time operations of the second circuit 315 and the first circuit 150. The clock generator 330 may be implemented with one or more phase-locked loops (PLLs), one or more frequency dividers, or any combination thereof. In certain aspects, the frequency of the clock signal is programmable (e.g., to support different performance modes), as discussed further below.

The clock controller 355 is coupled to the clock generator 330, and is configured to set (i.e., program) the frequency of the clock signal generated by the clock generator 330. For example, the clock controller 355 may be configured to set the frequency of the clock signal based on the performance mode of the second circuit 315 and/or another parameter, as discussed further below.

Figure 4:
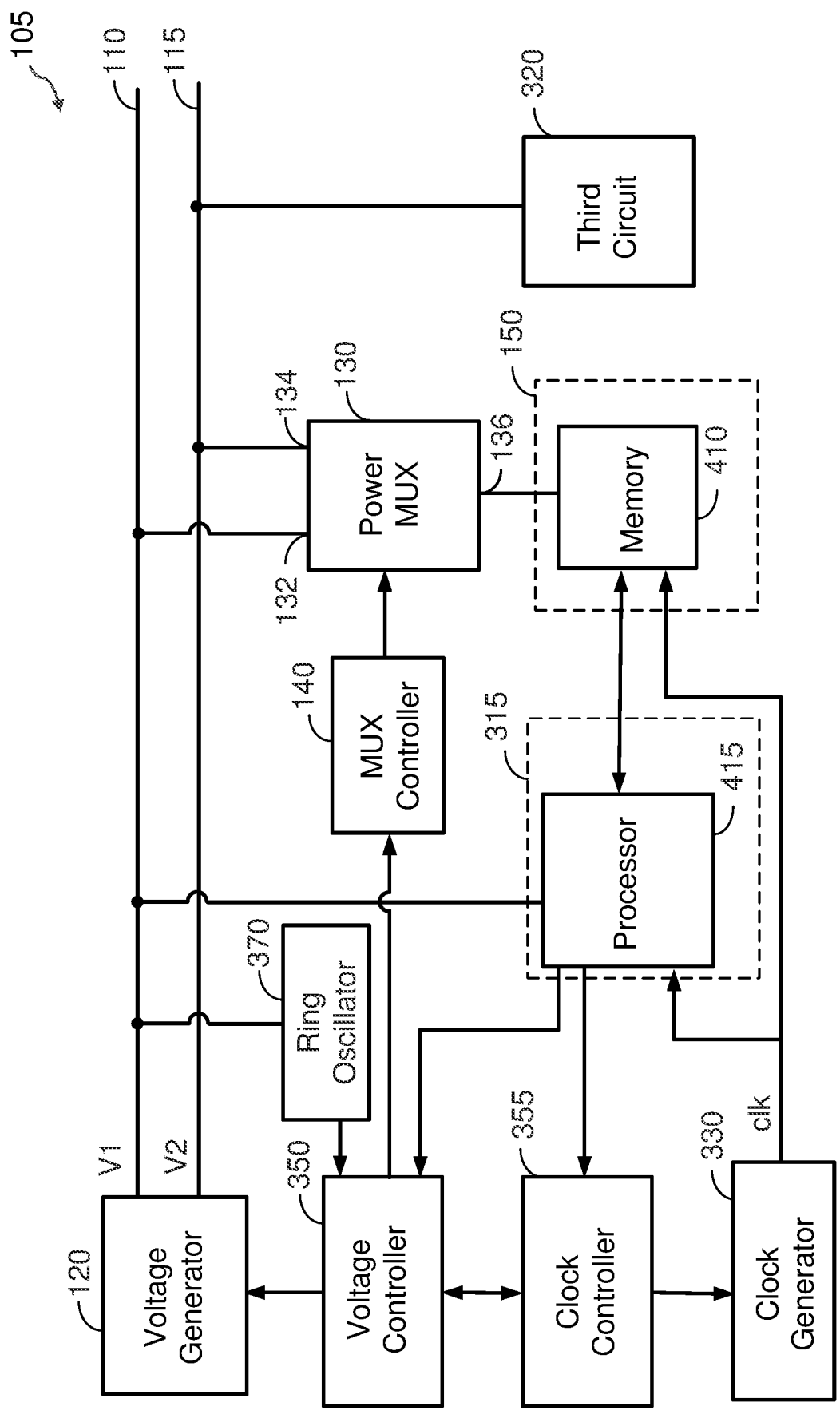
FIG. 4 shows an example in which the first circuit includes a memory and the second circuit includes a processor according to certain aspects of the present disclosure.

The second circuit 315 may operate in any one of multiple performance modes. For example, the second circuit 315 may include a processor 415 (shown in FIG. 4), in which the performance mode of the second circuit 315 depends on the processing load (i.e., computational load) of the processor 415. In this example, the second circuit 315 may operate in a higher performance mode when the processor 415 is performing a task with a high processing load, and operate in a lower performance mode when the processor 415 is performing a task with a low processing load.

In this example, the clock controller 355 may set the frequency of the clock signal based on the performance mode of the second circuit 315. For example, the second circuit 315 may send a request for a performance mode to the clock controller 355 (e.g., based on the processing needs of the processor 415). In response, the clock controller 355 sets the frequency of the clock signal based on the requested performance mode. In this example, the clock controller 355 may set the clock signal to a higher frequency for a higher performance mode than a lower performance mode. This is because the higher frequency allows the second circuit 315 to process data at higher processing speeds to support the higher performance mode.

The voltage controller 350 may set the voltage level of the first supply voltage based on the performance mode of the second circuit 315. For example, the second circuit 315 may send a request for a performance mode to the voltage generator 120 (e.g., based on the processing needs of the processor 415). In response, the voltage controller 350 sets the voltage level of the first supply voltage based on the requested performance mode. In this example, the voltage controller 350 may set the first supply voltage to a higher voltage level for a higher performance mode than a lower performance mode. This is because the higher voltage level increases the switching speeds of transistors in the second circuit 315, allowing the second circuit 315 to operate at a higher clock frequency.

In certain aspects, the voltage controller 350 determines the voltage level of the first supply voltage for a performance mode using a ring oscillator 370 coupled to the voltage controller 350. In this example, the ring oscillator 370 is coupled to the first power rail 110 to receive the first supply voltage. The ring oscillator 370 is configured to generate an oscillation signal having a frequency that depends on the voltage level of the first supply voltage, and output the oscillation signal to the voltage controller 350. The ring oscillator 370 is integrated on the same chip as the second circuit 315 such that the ring oscillator 370 is subject to similar conditions (e.g., temperature, process corner, aging, etc.) as the second circuit 315. As a result, the frequency of the oscillation signal provides an indication of the clock frequency at which the second circuit 315 can operate at a given voltage level and a given set of conditions.

In this example, the voltage controller 350 may measure the frequency of the oscillation signal from the ring oscillator 370 at different voltage levels of the first supply voltage, and determine the voltage level needed for the second circuit 315 to operate at the clock frequency of a performance mode based on the measured frequency at the different voltage levels. The voltage controller 350 may then set the first supply voltage to the determined voltage level when the second circuit 315 operates in the performance mode. In certain aspects, the voltage controller 350 may use the oscillation signal from the ring oscillator 370 to adjust (i.e., update) the voltage level of the first supply voltage for a performance mode over time (e.g., to adapt to changes in one or more conditions over time).

As discussed above, FIG. 4 shows the example where the second circuit 315 includes the processor 415. The processor 415 may be a processor of a central processing unit (CPU) core in some implementations. In the example shown in FIG. 4, the first circuit 150 includes a memory 410 coupled to the processor 415. In this example, the memory 410 may be used to store instructions that are executed by the processor 415 and/or data that is processed by the processor 415. The memory 410 may include cache memory (e.g., L1, L2, and/or L3 cache) and/or another type of memory. In this example, the memory 410 may include read/write circuitry (not shown) to allow the processor 415 to write instructions and/or data to the memory 410 and read instructions and/or data from the memory 410.

In certain aspects, the memory 410 requires a minimum voltage level for retaining instructions and/or data in the memory 410. In these aspects, the memory 410 may lose some or all of the instructions and/or data stored in the memory 410 if the voltage level of the memory 410 drops below the minimum voltage level. The minimum voltage level may be specified by a standard for the memory 410.

In certain aspects, the voltage controller 350 keeps the voltage level of the second supply voltage (labeled "V2") at or above a first threshold voltage level corresponding to the minimum voltage level. The first threshold voltage level may be equal to the minimum voltage level or slightly above the minimum voltage level to provide a safety margin. The first threshold voltage level may be programmable in some implementations. In these aspects, the voltage controller 350 may set the first supply voltage to a voltage level above or below the first threshold voltage level depending on the performance mode of the second circuit 315. For example, the voltage controller 350 may set the first supply voltage to a voltage level above the first threshold voltage level when the second circuit 315 is operating in a high performance mode (also referred to as a boosted performance mode), and set the first supply voltage to a voltage level below the first threshold voltage level when the second circuit 315 is operating in a low performance mode.

In this example, the voltage controller 350 may send a signal to the multiplexer controller 140 indicating the voltage level of the first supply voltage set by the voltage controller 350. In some implementations, the multiplexer controller 140 may couple the first circuit 150 to the first power rail 110 or the second power rail 115 based on the voltage level of the first supply voltage set by the voltage controller 350 and the first threshold voltage level.

For example, if the voltage level of the first supply voltage is above the first threshold voltage level due to the second circuit 315 operating in a high performance mode, then the multiplexer controller 140 may couple the first circuit 150 to the first power rail 110. In this case, the first circuit 150 and the second circuit 315 are both supplied with the first supply voltage, which allows the memory 410 in the first circuit 150 to operate at approximately the same clock frequency as the processor 415 in the second circuit 315 for fast memory access in the high performance mode.

If the voltage level of the first supply voltage is below the first threshold voltage level due to the second circuit 315 operating in a low performance mode, then the multiplexer controller 140 may couple the first circuit 150 to the second power rail 115. In this case, the first circuit 150 is supplied with the second supply voltage. Since the voltage level of the second supply voltage is kept at or above the first threshold voltage level, coupling the first circuit 150 to the second supply voltage allows the memory 410 to retain the instructions and/or data stored in the memory 410 while allowing the processor 415 (which is supplied with the first supply voltage) to operate at a lower voltage level than the first threshold voltage level in the low performance mode to reduce power. It is to be appreciated that the multiplexer controller 140 is not limited to the above examples, and that the multiplexer controller 140 may couple the first circuit 150 to the first power rail 110 or the second power rail 115 based on one or more additional conditions.

In certain aspects, the multiplexer controller 140 may be configured to switch the power multiplexer 130 between the first power rail 110 and the second power rail 115 when the voltage level of the first supply voltage transitions from a first level to a second level (e.g., due to a change in the performance mode of the second circuit 315) and one or more conditions are met. Examples of the one or more conditions are discussed further below. The first level may also be referred to as the starting voltage level, and the second level may also be referred to as a target voltage level since the second level is the voltage level of the first supply voltage at the end of the transition.

Figure 5:
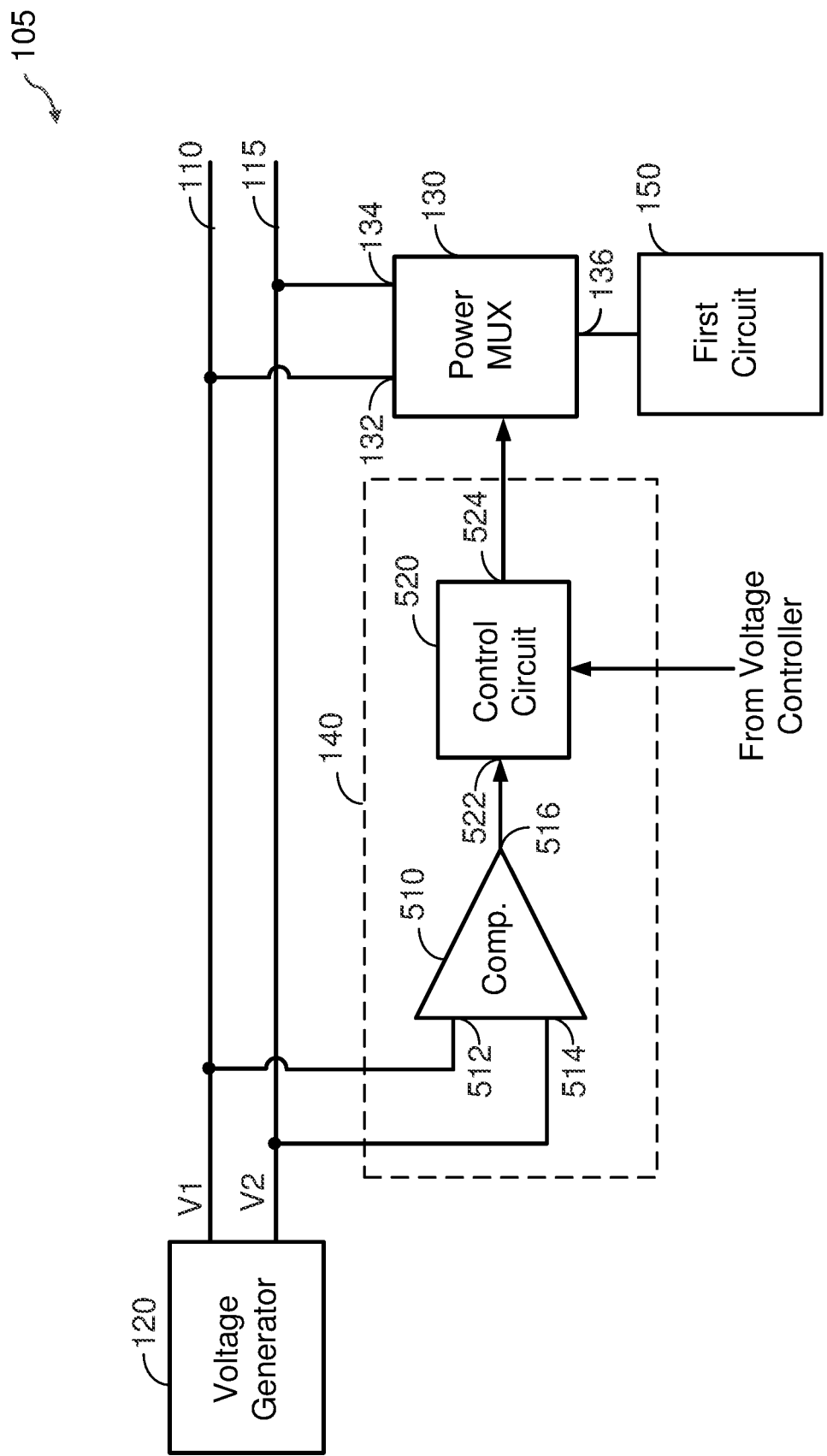
FIG. 5 shows an exemplary implementation of a multiplexer controller according to certain aspects of the present disclosure.

In certain aspects, during the transition of the voltage level of the first supply voltage, the multiplexer controller 140 compares the voltage level of first supply voltage with the voltage level of the second supply voltage, and causes the power multiplexer 130 to switch between the first power rail 110 and the second power rail 115 when the voltage level of first supply voltage crosses the voltage level of the second supply voltage. In this regard, FIG. 5 shows an exemplary implementation in which the multiplexer controller 140 includes a control circuit 520 and a comparator 510 to perform the above comparison according to certain aspects.

The comparator 510 has a first input 512, a second input 514, and an output 516. The first input 512 is coupled to the first power rail 110 and the second input 514 is coupled to the second power rail 115. The comparator 510 is configured to compare the voltage level of the first supply voltage at the first input 512 with the voltage level of the second supply voltage at the second input 514, and output a compare signal at the output 516 based on the comparison. For example, the compare signal may have a first value when the voltage level of the first supply voltage is greater than the voltage level of the second supply voltage (i.e., V1>V2), and a second value when the voltage level of the first supply voltage is less than the voltage level the voltage level of the second supply voltage (i.e., V1<V2). The first value may be logic one and the second value may be logic zero, or vice versa.

The control circuit 520 has an input 522 coupled to the output 516 of the comparator 510 and an output 524 coupled to the power multiplexer 130. The control circuit 520 may also be coupled to the voltage controller 350 to receive information from the voltage controller 350. For example, when the voltage controller 350 sends a command to the voltage generator 120 to change the voltage level of the first supply voltage to the target level discussed above, the voltage controller 350 may send a signal to the control circuit 520 indicating the target level. The control circuit 520 may then determine that the voltage level of the first supply voltage is transitioning to the target level based on the signal from the voltage controller 350. The voltage controller 350 may also communicate the voltage level of the second supply voltage to the control circuit 520.

In certain aspects, the control circuit 520 is configured to monitor the compare signal from the comparator 510 during a transition of the voltage level of the first supply voltage, and detect when the voltage level of the first supply voltage crosses the voltage level of the second supply voltage during the transition based on the compare signal. For example, the control circuit 520 may detect that the voltage level of the first supply voltage has crossed the voltage level of the second supply voltage when the compare signal flips (i.e., changes) values. After detecting the crossing, the control circuit 520 may switch the power multiplexer 130 between the first power rail 110 and the second power rail 115. Switching between the power rails 110 and 115 when the voltage level of the first supply voltage crosses the voltage level of the second supply voltage helps ensure that voltage level difference between the first supply voltage and the second supply voltage is small at the time of the switching, which reduces potential cross current between the power rails 110 and 115.

Figure 6:
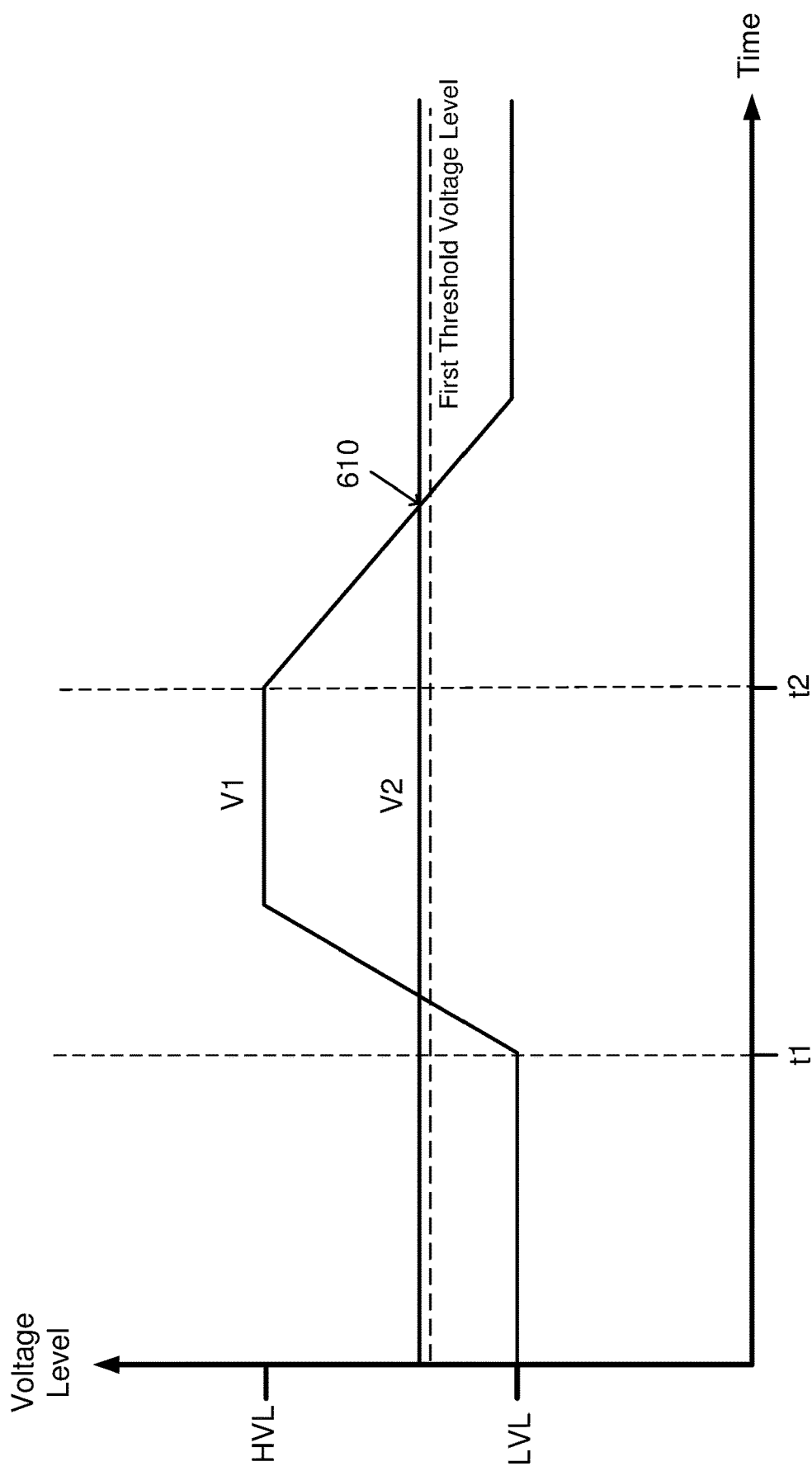
FIG. 6 is a timing diagram showing an example of the voltage level of a first supply voltage and the voltage level of a second supply voltage over time according to certain aspects of the present disclosure.

Exemplary operations of the multiplexer controller 140 will now be discussed according to certain aspects with reference to FIG. 6. FIG. 6 is a timing diagram showing an example of the voltage level of the first supply voltage (labeled "V1") and the voltage level of the second supply voltage (labeled "V2") over time. The voltage level of the second supply voltage is constant in the example shown in FIG. 6. However, it is to be appreciated that this need not be the case. The timing diagram also shows an example of the first threshold voltage level represented by a dashed line. In the example in FIG. 6, the voltage level of the second voltage supply is shown being slightly above the first threshold voltage level of the memory 410. However, it is to be appreciated that the voltage level of the second supply voltage may be above the first threshold voltage level by a larger amount in other examples.

In the example in FIG. 6, the first supply voltage is initially at a low voltage level (labeled "LVL") that is below the first threshold voltage level. The low voltage level may correspond to a low performance mode of the second circuit 315 (e.g., the processor 415). In this example, the power multiplexer 130 initially couples the first circuit 150 to the second power rail 115, and the first circuit 150 is supplied with the second supply voltage (e.g., to retain instructions and/or data in the memory 410).

Starting at time t1, the first voltage supply transitions from the low voltage level to a target voltage level that is above the first threshold voltage level. In the example in FIG. 6, the target voltage level is equal to a high voltage level (labeled "HVL"), which may correspond to a high performance mode of the second circuit 315. In this example, the voltage controller 350 may initiate the transition to the high voltage level in response to a request from the second circuit (e.g., the processor 415) for the high performance mode (e.g., due to increased processor utilization). In this example, the voltage controller 350 sends a signal to the control circuit 520 in the multiplexer controller 140 indicating the target voltage level, which is equal to the high voltage level in this example. The control circuit 520 may then determine that the target voltage level indicated by the signal is above the first threshold voltage level (i.e., the target voltage level>the first threshold voltage level).

After determining the target voltage level is above the first threshold voltage level, the control circuit 520 monitors the compare signal from the comparator 510 during the transition to detect when the voltage level of the first supply voltage crosses above the voltage level of the second supply voltage. As shown in the example in FIG. 6, the voltage level of the first supply voltage ramps up from the low voltage level to the target voltage level. When the compare signal flips values indicating the voltage level of the first supply voltage has crossed above the voltage level of the second supply voltage, the control circuit 520 may cause the power multiplexer 130 to switch from the second power rail 115 to the first power rail 110 (e.g., by turning off the second switching circuit 215 and turning on the first switching circuit 210). Thus, in this example, the control circuit 520 causes the power multiplexer 130 to switch to the first power rail 110 when the following conditions are met: the voltage level of the first supply voltage>the voltage level of the second supply voltage (as determined from the compare signal of the comparator 510), and the target voltage level>the first threshold voltage level.

Starting at time t2, the first voltage supply transitions from the high voltage level to a target voltage that is below the voltage level. In the example in FIG. 6, the target voltage level is equal the low voltage level (labeled "LVL"), which may correspond to the low performance mode discussed above. In this example, the voltage controller 350 may initiate the transition to the low voltage level in response to a request from the second circuit 315 for the low performance mode (e.g., due to reduced processor utilization). In this example, the voltage controller 350 sends a signal to the control circuit 520 in the multiplexer controller 140 indicating the target voltage level, which is equal to the low voltage level in this example. The control circuit 520 may then determine that the target voltage level indicated by the signal is below the first threshold voltage level (i.e., the target voltage level<the first threshold voltage level).

After determining the target voltage level is below the first threshold voltage level, the control circuit 520 monitors the compare signal from the comparator 510 during the transition to detect when the voltage level of the first supply voltage crosses below the voltage level of the second supply voltage. As shown in the example in FIG. 6, the voltage level of the first supply voltage ramps down from the high voltage level to the target voltage level. When the compare signal flips values indicating the voltage level of the first supply voltage has crossed below the voltage level of the second supply voltage, the control circuit 520 may cause the power multiplexer 130 to switch from the first power rail 110 to the second power rail 115 (e.g., by turning off the first switching circuit 210 and turning on the second switching circuit 215). Thus, in this example, the control circuit 520 causes the power multiplexer 130 to switch to the second power rail 115 when the following conditions are met: the voltage level of the first supply voltage<the voltage level of the second supply voltage (as determined from the compare signal of the comparator 510), and the target voltage level<the first threshold voltage level.

Figure 7:
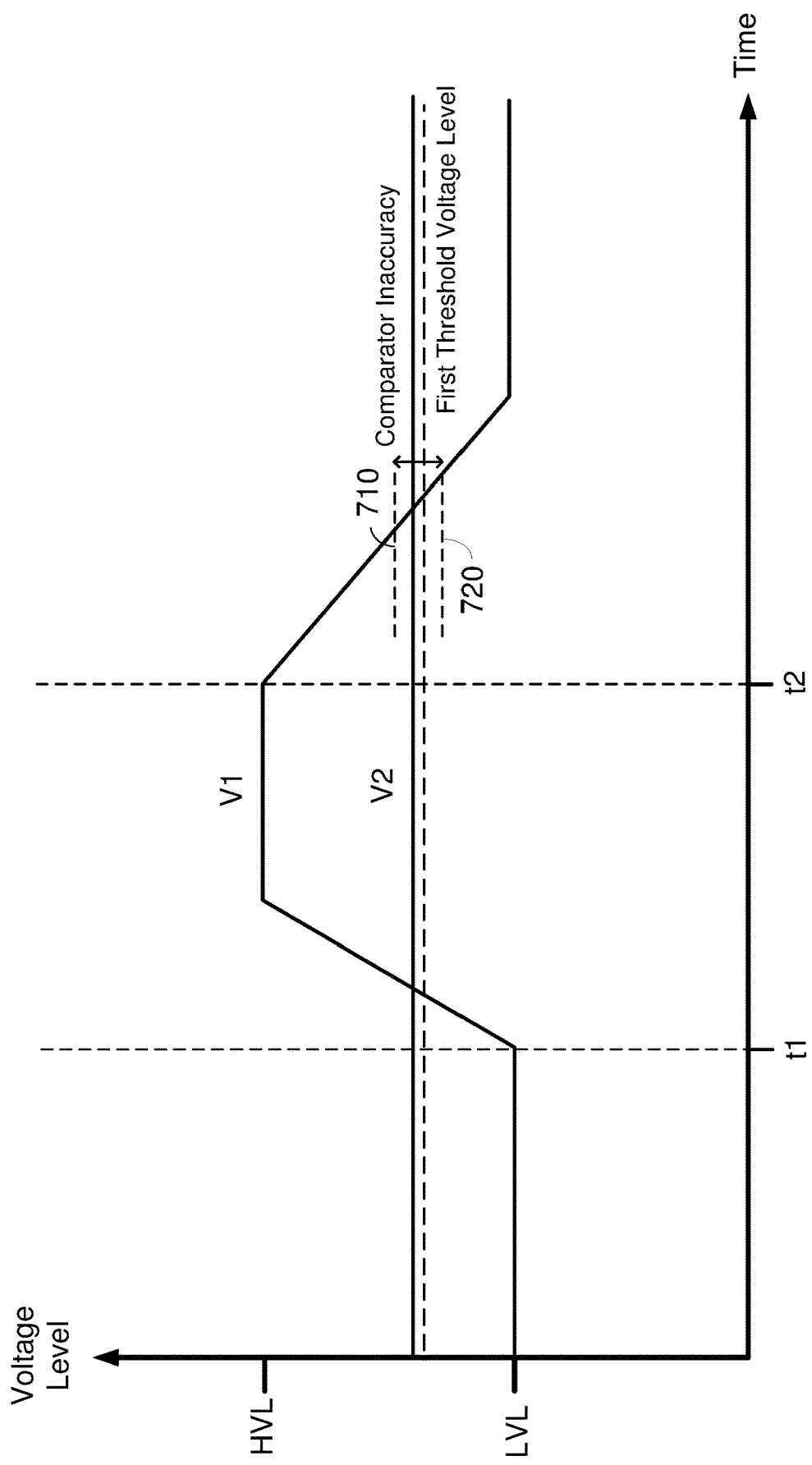
FIG. 7 shows the timing diagram of FIG. 6 with a voltage level range corresponding to inaccuracy of a comparator according to certain aspects of the present disclosure.

Ideally, the control circuit 520 causes the power multiplexer 130 to switch from the first power rail 110 to the second power rail 115 at the instant 610 the voltage level of the first supply voltage crosses below the voltage level of the second supply voltage. However, in practice, the comparator 510 does not have perfect accuracy (e.g., due to mismatches between transistors in the comparator 510). The inaccuracy of the comparator 510 causes the compare signal to flip when the voltage level of the first supply voltage is somewhere within a voltage level range around the voltage level of the second supply voltage. The voltage level range may also be referred to as an inaccuracy range. An example of the voltage level range is illustrated in FIG. 7, which shows an example of an upper bound 710 and a lower bound 720 of the voltage level range. In this example, a portion of the voltage level range is below the first threshold voltage level. As a result, the compare signal may potentially flip when the voltage level of the first supply voltage is below the first threshold voltage level. In this case, the voltage level of the first circuit 150 temporarily falls below the first threshold voltage level before the power multiplexer 130 switches the first circuit 150 to the second supply voltage. As a result, the memory 410 may be temporarily undervolted in which the voltage level of the memory 410 falls below the minimum voltage level needed to retain the instructions and/or data stored in memory 410.

Another challenge is latency related to the control circuit 520, which delays the time the control circuit 520 causes the power multiplexer 130 to switch from the first power rail 110 to the second power rail 115 after the compare signal flips. The latency may include inherent delays in the control circuit 520. In some implementations, the clock generator 330 may temporarily stop the clock signal during a transition to avoid timing issues during the transition. In these implementations, the control circuit 520 may need to wait for the clock signal to stop before causing the power multiplexer 130 to switch, which contributes to the latency of the control circuit 520.

The latency may cause the voltage level of the first circuit 150 (e.g., the memory 410) to fall an additional amount equal to the latency times the voltage level ramp rate of the first supply voltage. For example, for a latency of 740 ns and a voltage level ramp rate of −38 mV/μs, the voltage level of the first circuit 150 (e.g., the memory 410) may fall an additional 28 mV after the compare signal flips due to the latency. Thus, the latency may cause the voltage level of the first circuit 150 (e.g., the memory 410) to fall below the first threshold voltage level before the power multiplexer 130 switches to the second power rail 115 (i.e., the second supply voltage), which may exacerbate undervolting.

To address the above, aspects of the present disclose provide a comparator offset for the comparison by the comparator 510. In certain aspects, the comparator offset compensates for inaccuracy of the comparator 510 and/or latency related to the control circuit 520 to prevent undervolting (e.g., when the voltage level of the second supply voltage is close to the first threshold voltage level). The above features and other features of the present disclosure are discussed further below.

Figure 8:
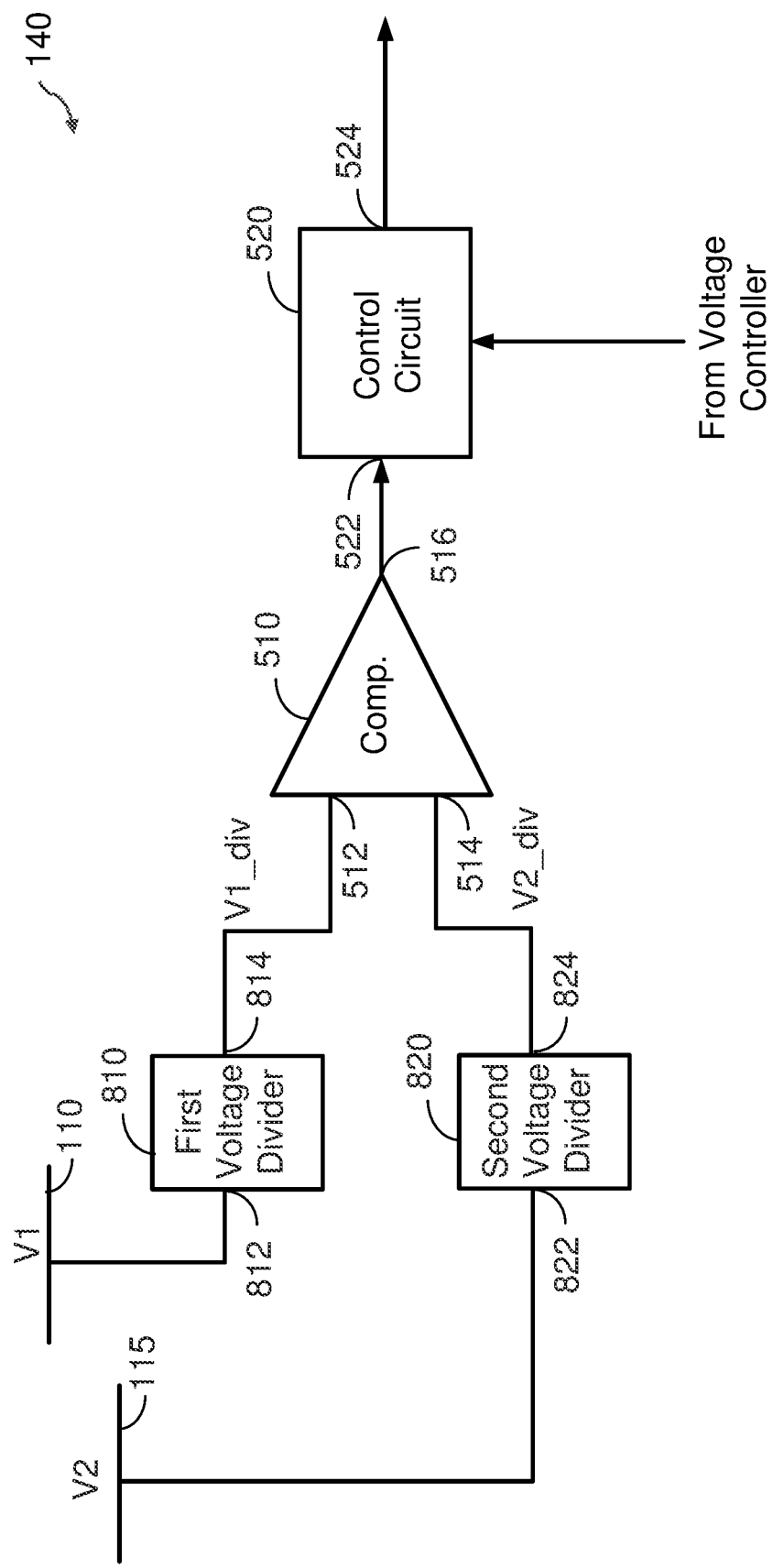
FIG. 8 shows an example of a multiplexer controller including a comparator, a first voltage divider, and a second voltage divider according to certain aspects of the present disclosure.

FIG. 8 shows an exemplary implementation of the multiplexer controller 140 according to certain aspects. In this example, the multiplexer controller 140 includes the comparator 510 and the control circuit 520 discussed above. The multiplexer controller 140 further includes a first voltage divider 810 and a second voltage divider 820. As discussed further below, the first voltage divider 810 and the second voltage divider 820 may be used to provide a comparator offset for the comparison by the comparator 510.

The first voltage divider 810 has an input 812 and an output 814, in which the input 812 is coupled to the first power rail 110, and the output 814 is coupled to the first input 512 of the comparator 510. The first voltage divider 810 is configured to receive the first supply voltage (labeled "V1") at the input 812, divide the first supply voltage by a first divider to obtain a first divided voltage (labeled "V1_div"), and output the first divided voltage to the first input 512 of the comparator 510 via the output 814. The first voltage divider 810 may be implemented with a resistive voltage divider, or another type of voltage divider.

The second voltage divider 820 has an input 822 and an output 824, in which the input 822 is coupled to the second power rail 115, and the output 824 is coupled to the second input 514 of the comparator 510. The second voltage divider 820 is configured to receive the second supply voltage (labeled "V2") at the input 822, divide the second supply voltage by a second divider to obtain a second divided voltage (labeled "V2_div"), and output the second divided voltage to the second input 514 of the comparator 510 via the output 824. The second voltage divider 820 may be implemented with a resistive voltage divider, or another type of voltage divider.

Thus, in this example, the comparator 510 compares the first divided voltage with the second divided voltage instead of directly comparing the first supply voltage with the second supply voltage as is done in FIG. 5. In this example, the first voltage divider 810 and the second voltage divider 820 provide a comparator offset by making the first divider of the first voltage divider 810 different from the second divider of the second voltage divider 820, as discussed further below.

In this example, the first divided voltage is given by V1/div1 where div 1 is the first divider of the first voltage divider 810, and the second divided voltage is given by V2/div2 where div2 is the second divider of the second voltage divider 820. Thus, in this example, the comparator 510 compares V1/div1 with V2/div2. This is equivalent to comparing V1 with V2+Δ_comp where Δ_comp is the comparator offset given by:

$$\Delta\_comp = V2\left(\frac{div1 - div2}{div2}\right). \qquad Eq(1)$$

As shown in Eq (1), the comparator offset is positive when the first divider is greater than the second divider, and the comparator offset is negative when the first divider is less than the second divider. Thus, the comparator offset can be made positive or negative by setting the first divider and/or the second divider accordingly. When the first divider and the second divider are the same (i.e., equal), the comparator offset is zero, which is equivalent to comparing V1 with V2. It should be appreciated that comparing V1 with V2+Δ_comp is equivalent to comparing V1-Δ_comp with V2.

In certain aspects, the first voltage divider 810 and/or the second voltage divider 820 may be programmable. For the example where the first voltage divider 810 is programmable, the control circuit 520 may program (i.e., set) the comparator offset by programming (i.e., setting) the first divider of the first voltage divider 810. For the example where the second voltage divider 820 is programmable, the control circuit 520 may program (i.e., set) the comparator offset by programming (i.e., setting) the second divider of the second voltage divider 820. For the example where both the first voltage divider 810 and the second voltage divider 820 are programmable, the control circuit 520 may program (i.e., set) the comparator offset by programming the first divider of the first voltage divider 810 and/or programming the second divider of the second voltage divider 820.

In certain aspects, the comparator offset may be programmed to prevent undervolting when the first supply voltage transitions from a voltage level above the first threshold voltage level (e.g., HVL) to a target voltage level (e.g., LVL) below the first threshold voltage level. In these aspects, the control circuit 520 may program the comparator offset to a positive voltage that provides enough safety margin to prevent undervolting. For example, to prevent undervolting, the comparator offset may be programmed based on the latency of the control circuit 520, the ramp-down rate of the first supply voltage during the transition, and/or the inaccuracy range of the comparator 510. As discussed above, the control circuit 520 may program the comparator offset by programming the first divider of the first voltage divider 810 and/or programming the second divider of the second voltage divider 820.

Exemplary operations of the multiplexer controller 140 will now be discussed according to certain aspects for case where the first supply voltage transitions from a voltage level above the first threshold voltage level (e.g., HVL) to a target voltage level (e.g., LVL) below the first threshold voltage level. In this example, the power multiplexer 130 initially couples the first circuit 150 to the first power rail 110 (i.e., the first supply voltage).

In this example, the voltage controller 350 may initiate the transition to the target voltage level (e.g., LVL) in response to a request from the second circuit 315 (e.g., the processor 415) for the low performance mode (e.g., due to reduced processor utilization). In this example, the voltage controller 350 sends a signal to the control circuit 520 in the multiplexer controller 140 indicating the target voltage level. The control circuit 520 may then determine that the target voltage level indicated by the signal is below the first threshold voltage level (i.e., the target voltage level<the first threshold voltage level).

After determining the target voltage level is below the first threshold voltage level, the control circuit 520 monitors the compare signal from the comparator 510 to detect when the compare signal flips. In this example, the comparator 510 compares the voltage level of the first divided voltage from the first voltage divider 810 with the voltage level of the second divided voltage from the second voltage divider 820. This comparison is equivalent to comparing the voltage level of the first supply voltage with a compare voltage level including the voltage level of the second supply voltage and the comparator offset (i.e., V2+Δ_comp), wherein the comparator offset is positive in this example. During the transition, the control circuit 520 causes the power multiplexer 130 to switch from the first power rail 110 to the second power rail 115 after the control circuit 520 detects the compare signal flip (e.g., from the first value to the second value), indicating V1<V2+Δ_comp. Thus, in this example, the control circuit 520 causes the power multiplexer 130 to switch to the second power rail 115 when the following conditions are met: V1<V2+Δ_comp (as determined from the compare signal), and the target voltage level<the first threshold voltage level.

In this example, the comparator offset causes the control circuit 520 to initiate the switching of the power multiplexer 130 from the first power rail 110 to the second power rail 115 at an earlier time compared with the case without the comparator offset. Initiating the switch earlier helps prevent undervolting during the transition. This is because initiating the switch earlier helps ensure that the power multiplexer 130 switches the first circuit 150 to the second power rail (i.e., the second supply voltage) before the voltage level of the first supply voltage falls below the minimum voltage level for the first circuit 150 to function (e.g., the minimum voltage level needed to retain the instructions and/or data for the example where the first circuit 150 includes the memory 410).

In certain aspects, the multiplexer controller 140 may operate in a first mode or a second mode, in which the comparator offset is enabled in the first mode and the comparator offset is disabled in the second mode. The first mode may also be referred to as a protection mode, in which the comparator offset is enabled to provide protection against undervolting. The second mode may also be referred to as a default mode.

In certain aspects, the control circuit 520 operates the multiplexer controller 140 in the first mode or the second mode when the first supply voltage transitions downward based on the voltage level of the second supply voltage. For example, the control circuit 520 may compare the voltage level of the second supply voltage with a second threshold voltage level, and operate the multiplexer controller 140 in the first mode or the second mode based on the comparison. The second threshold voltage level may be above the first threshold voltage level, and may be set such that the potential of undervolting is very low when the voltage level of the second supply voltage is above the second threshold voltage level.

In this example, the control circuit 520 operates the multiplexer controller 140 in the first mode (e.g., protection mode) when the voltage level of the second supply voltage is below the second threshold voltage level (i.e., V2<second threshold voltage level). In this case, the control circuit 520 enables the comparator offset (e.g., by programming the first divider and/or the second divider to achieve the comparator offset) to protect against undervolting. The control circuit 520 may operate the multiplexer controller 140 in the second mode (e.g., default mode) when the voltage level of the second supply voltage is above the second threshold voltage level (i.e., V2>second threshold voltage level). In this case, the control circuit 520 may disable the comparator offset by programming the first divider and/or the second divider such that the first divider and the second divider are equal. As discussed above, the comparator offset is zero when the first divider and the second divider are equal. It is to be appreciated that the present disclosure is not limited to this example. For example, in other implementations, the control circuit 520 may operate in another mode when the voltage level of the second supply voltage is above the second threshold voltage level. An example of the other mode is discussed further below.

Figure 9A:
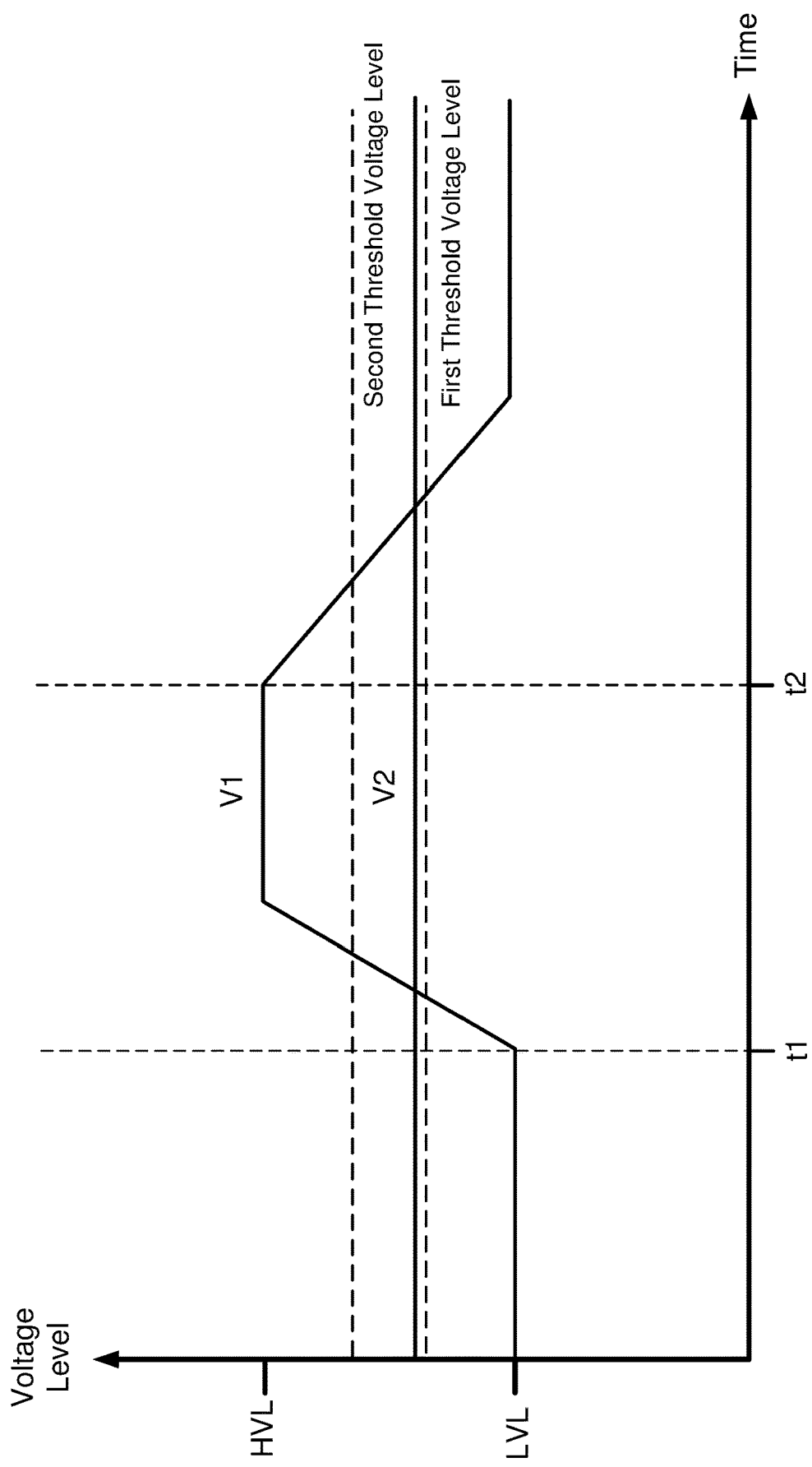
FIG. 9A is a timing diagram showing an example of the voltage level of the first supply voltage and the voltage level of the second supply voltage over time for a first mode according to certain aspects of the present disclosure.

Exemplary operations in the first mode and the second mode will now be discussed with references to FIGS. 9A and 9B according to certain aspects. FIG. 9A illustrates an example of operation in the first mode (e.g., protection mode) during the downward transition of the first supply voltage starting t2. In this example, the voltage level of the second supply voltage (labeled "V2") is below the second threshold voltage level. As a result, the control circuit 520 operates in the first mode and enables the comparator offset during the downward transition of the first supply voltage. In this case, the voltage level of the second supply voltage being below the second threshold voltage level may indicate a potential danger of undervolting.

In the example in FIG. 9A, the first supply voltage transitions from the high voltage level to a target voltage level below the first voltage threshold level starting at time t2. In this example, the target voltage level is equal to the low voltage level. However, it is to be appreciated that the present disclosure is not limited to this example. In this example, the control circuit 520 may receive a signal from the voltage controller 350 indicating the target voltage level before the transition occurs. The control circuit 520 may then determine that the target voltage level indicated in the received signal is below the first threshold voltage level. The control circuit 520 may also determine the starting voltage level of the first supply voltage based on a previous signal received from the voltage controller 350 indicating the voltage level. Based on the starting voltage level and the target voltage level, the control circuit 520 may determine that the first supply voltage is transitioning downward from the starting voltage level (e.g., HVL) to the target voltage level (e.g., LVL), in which the target voltage level is below the first threshold voltage level (i.e., the target voltage level<the first threshold voltage level), After determining the target voltage level is below the first threshold voltage level, the control circuit 520 monitors the compare signal from the comparator 510 during the transition to detect when the compare signal flips. In this example, the comparator 510 compares the voltage level of the first divided voltage from the first voltage divider 810 with the voltage level of the second divided voltage from the second voltage divider 820. This comparison is equivalent to comparing the voltage level of the first supply voltage with a compare voltage level including the voltage level of the second supply voltage and the comparator offset (i.e., V2+Δ_comp) since the comparator offset is enabled in the first mode (e.g., protection mode). During the downward transition of the first supply voltage, the control circuit 520 causes the power multiplexer 130 to switch from the first power rail 110 to the second power rail 115 after the control circuit 520 detects the compare signal flip (i.e., change), indicating V1<V2+Δ_comp. Thus, in this example, the control circuit 520 causes the power multiplexer 130 to switch from the first power rail 110 to the second power rail 115 when the following conditions are met: V1<V2+Δ_comp (as determined from the compare signal), and the target voltage level<the first threshold voltage level. As discussed above, the comparator offset helps prevent undervolting.

Figure 9B:
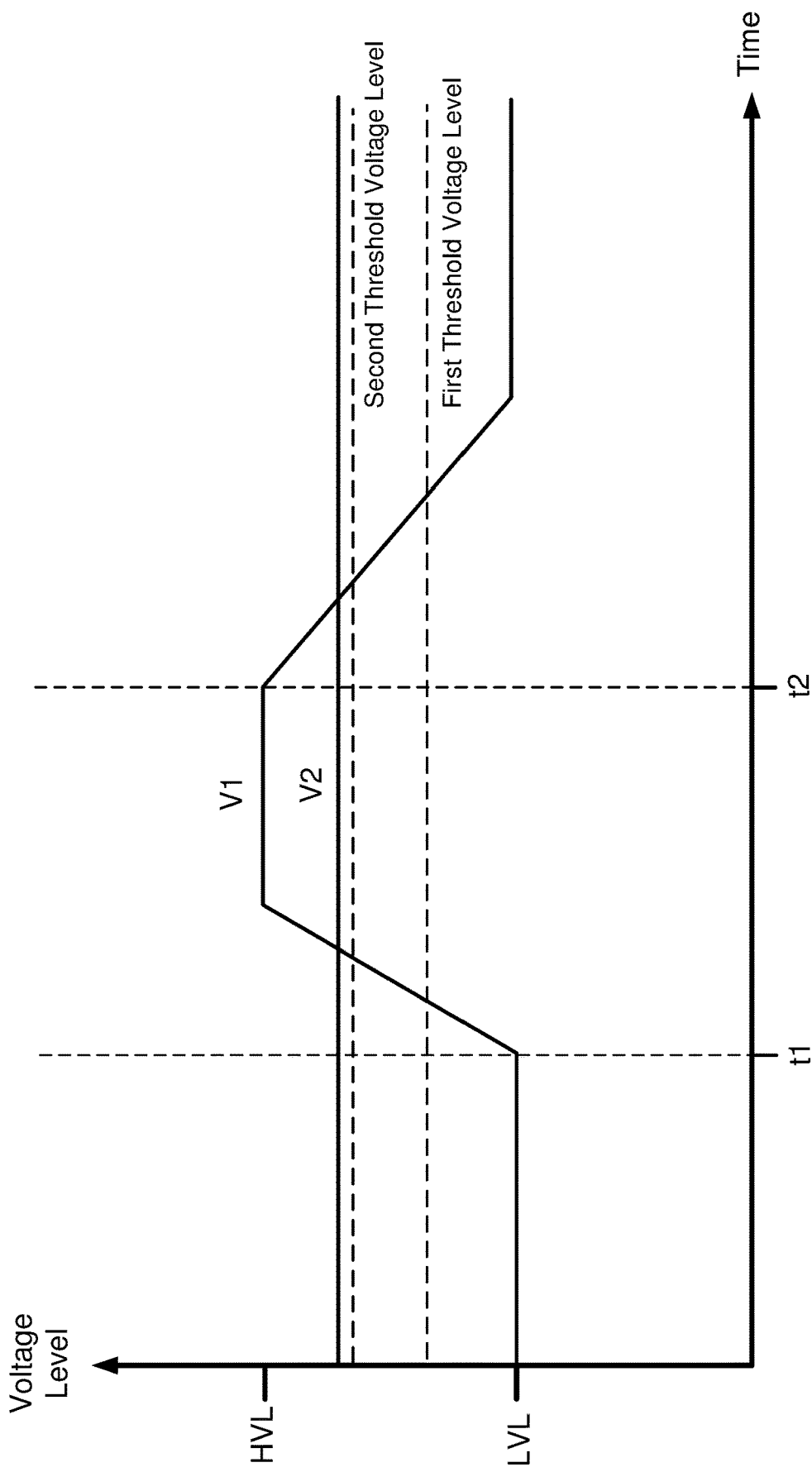
FIG. 9B is a timing diagram showing an example of the voltage level of the first supply voltage and the voltage level of the second supply voltage over time for a second mode according to certain aspects of the present disclosure.

FIG. 9B shows an example in which the voltage level of the second supply voltage is above the second threshold voltage. In this case, the control circuit 520 may operate in the second mode (e.g., default mode) or another mode (an example of which is discussed below). In the second mode, the multiplexer controller 140 operates in a similar manner as discussed above with reference to FIG. 6 since the comparator 510 compares V1 with V2 with the comparator offset disabled in the second mode. Thus, a detailed description of operation when the comparator 510 compares V1 with V2 is not repeated here for brevity.

Exemplary operations are discussed above for the case of a downward transition of the first supply voltage from a starting voltage level above the first threshold voltage level to a target voltage level below the first threshold voltage level. Exemplary operations for the case of an upward transition of the first supply voltage from a starting voltage level below the first threshold voltage level to a target voltage level above the first threshold voltage level are discussed below according to certain aspects.

In some cases where the voltage level of the second supply voltage is high, the control circuit 520 may fail to cause the power multiplexer 130 to switch from the second supply voltage to the first supply voltage during an upward transition due to inaccuracy of the comparator 510. An example of this is illustrated in the timing diagram in FIG. 10. In this example, the voltage level of the second supply voltage (labeled "V2") is high. For example, the voltage level of the second supply voltage may be high when the third circuit 320 (which shares the second power rail 115 with the first circuit 150) operates in a performance mode with a higher voltage level.

Figure 10:
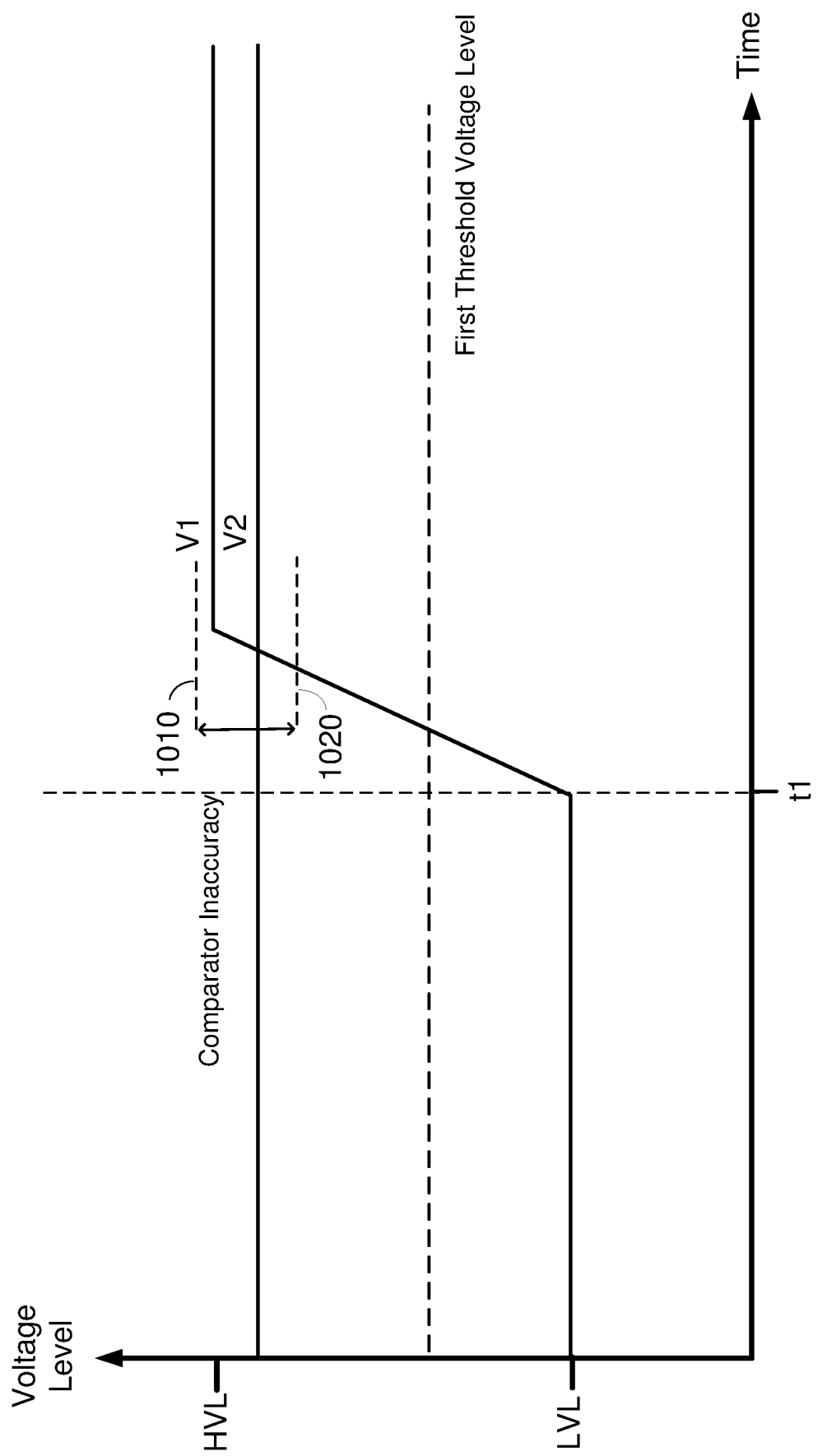
FIG. 10 is a timing diagram showing an example of the voltage level of the first supply voltage and the voltage level of the second supply voltage over time for a third mode according to certain aspects of the present disclosure.

In the example in FIG. 10, the first supply voltage (labeled "V1") is initially at a low voltage level (labeled "LVL") that is below the first threshold voltage level. The low voltage level may correspond to a low performance mode of the second circuit 315. In this example, the power multiplexer 130 initially couples the first circuit 150 to the second power rail 115, and the first circuit 150 is supplied with the second supply voltage.

Starting at time t1, the first voltage supply transitions upward from the low voltage level to a target voltage level that is above the first threshold voltage level. In the example in FIG. 6, the target voltage level is equal to a high voltage level (labeled "HVL"), which may correspond to a high performance mode of the second circuit 315. In this example, the voltage controller 350 may initiate the transition to the high voltage level in response to a request from the second circuit 315 (e.g., the processor 415) for the high performance mode (e.g., due to increased processor utilization). In this example, the voltage controller 350 sends a signal to the control circuit 520 indicating the target voltage level, and the control circuit 520 may determine that the target voltage level indicated by the signal is above the first threshold voltage level (i.e., the target voltage level>the first threshold voltage level). In the example shown in FIG. 10, the voltage level of the second supply voltage is close to the target voltage level for the first supply voltage, in which the difference between the voltage level of the second supply voltage and the target voltage level is within the inaccuracy range of the comparator 510. FIG. 10 shows the upper bound 1010 and the lower bound 1020 of the inaccuracy range.

After determining the target voltage level is above the first threshold voltage level, the control circuit 520 monitors the compare signal from the comparator 510 during the transition. In this example, the comparator 510 compares the voltage level of the first supply voltage and the voltage level of the second supply. In this example, the control circuit 520 may be configured to cause the power multiplexer 130 to switch from the second power rail 115 to the first power rail 110 when the compare signal flips, indicating the first supply voltage has crossed the second supply voltage. However, since the difference between the voltage level of the second supply voltage and the target voltage level is within the inaccuracy range of the comparator 510 in this example, there is a possibility that the compare signal fails to flip, in which case the power multiplexer controller 140 fails to switch from the second power rail 115 to the first power rail 110.

To address this, aspects of the present disclosure provide a third mode to help ensure the power multiplexer 130 switches to the first supply voltage for an upward transition of the first supply voltage. The third mode may also be referred to as a performance mode. In the third mode, the control circuit 520 enables the comparator offset and programs the comparator offset to a negative offset voltage (e.g., by programming the first divider to be less than the second divider). The magnitude of the comparator offset may be set based on the inaccuracy range of the comparator 510 to help ensure that the compare signal flips for an upward transition even with comparator inaccuracy.

In certain aspects, for the case of an upward transition of the first supply voltage from a starting voltage level below the first threshold voltage level to a target voltage level above the first threshold voltage level, the control circuit 520 may determine whether to operate in the third mode (e.g., performance mode). For example, the control circuit 520 may compare the voltage level of the second supply voltage (e.g., as indicated by the voltage controller 350) with a third threshold voltage. The third threshold voltage level may be the same as or different from the second threshold voltage level. In this example, the control circuit 520 may determine to operate in the third mode when the voltage level of the second supply voltage is above the third threshold voltage level and operate in the second mode (e.g., default mode) or another mode (e.g., the first mode) when the voltage level of the second supply voltage is below the third threshold voltage level. In this example, the voltage level of the second supply voltage being above the third threshold voltage level may indicate that the voltage level of the second supply voltage is high. It is to be appreciated that the present disclosure is not limited to this example. For example, in other implementations, the control circuit 520 may operate in the first mode (e.g., protection) when the voltage level of the second supply voltage is below the second threshold voltage level, as discussed further below.

Exemplary operations of the multiplexer controller 140 in the third mode will now be discussed according to certain aspects for case where the first supply voltage transitions from a starting voltage level below the first threshold voltage level (e.g., LVL) to a target voltage level (e.g., HVL) above the first threshold voltage level. In this example, the power multiplexer 130 initially couples the first circuit 150 to the second power rail 115 (i.e., the second supply voltage).

In this example, the voltage controller 350 may initiate the transition to the target voltage level (e.g., HVL) in response to a request from the second circuit 315 (e.g., the processor 415) for the high performance mode (e.g., due to an increase in processor utilization). In this example, the voltage controller 350 sends a signal to the control circuit 520 in the multiplexer controller 140 indicating the target voltage level before the transition occurs. The control circuit 520 may then determine that the target voltage level indicated by the signal is above the first threshold voltage level (i.e., the target voltage level>the first threshold voltage level).

After determining the target voltage level is above the first threshold voltage level, the control circuit 520 monitors the compare signal from the comparator 510 to detect when the compare signal flips (i.e., changes). In this example, the comparator 510 compares voltage level of the first divided voltage from the first voltage divider 810 with the voltage level of the second divided voltage from the second voltage divider 820. This comparison is equivalent to comparing the voltage level of the first supply voltage with a compare voltage level including the voltage level of the second supply voltage and the comparator offset (i.e., $V2+\Delta\_comp$), wherein the comparator offset is negative offset voltage. During the transition, the control circuit 520 causes the power multiplexer 130 to switch from the second power rail 115 to the first power rail 110 after the control circuit 520 detects the compare signal flip (i.e., change), indicating $V1>V2+\Delta\_comp$ where $\Delta\_comp$ is a negative offset voltage. Thus, in this example, the control circuit 520 causes the power multiplexer 130 to switch to the first power rail 110 when the following conditions are met: $V1>V2+\Delta\_comp$ (as determined from the compare signal), and the target voltage level>the first threshold voltage level. In this example, the comparator offset (which is negative in this example) favors switching to the first supply voltage, which helps ensure that the power multiplexer 130 switches to the first supply voltage during the upward transition even with comparator inaccuracy.

It is to be appreciated that the present disclosure is not limited to the above examples. For example, in some implementations, the third threshold voltage level may be the same as the second threshold voltage level. In these implementations, the control circuit 520 may compare the voltage level of the second supply voltage with the second threshold voltage, and operate in the first mode or the second mode based on the comparison. For example, the control circuit 520 may operate in the first mode (e.g., protection mode) when the voltage level of the second supply voltage is less than the second threshold voltage level for both upward transitions and downward transitions of the first supply voltage crossing the first threshold voltage level. Also, the control circuit 520 may operate in the third mode (e.g., performance mode) when the voltage level of the second supply voltage is greater than the second threshold voltage level for both upward transitions and downward transitions of the first supply voltage crossing the first threshold voltage level. In these implementations, the control circuit 520 may operate in the second mode (e.g., default mode) when the first supply voltage is not undergoing a transition that crosses the first threshold voltage level. The control circuit 520 may also operate in the second mode (e.g., default mode) in a legacy mode where the multiplexer controller 140 operates in the manner discussed above with reference to FIG. 5.

As discussed above, the voltage controller 350 may send the signal indicating the target voltage level to the control circuit 520 before the transition of the first supply voltage to the target voltage level occurs. This gives the control circuit 520 time to enable the comparator 510 and/or to program the first voltage divider 810 and/or the second voltage divider 820 to set the comparator offset (e.g., set the comparator offset to a positive or negative voltage offset). During the transition, the comparator offset compensates for inaccuracy of the comparator 510 and/or latency related to the control circuit 520 for more robust operation.

Figure 11:
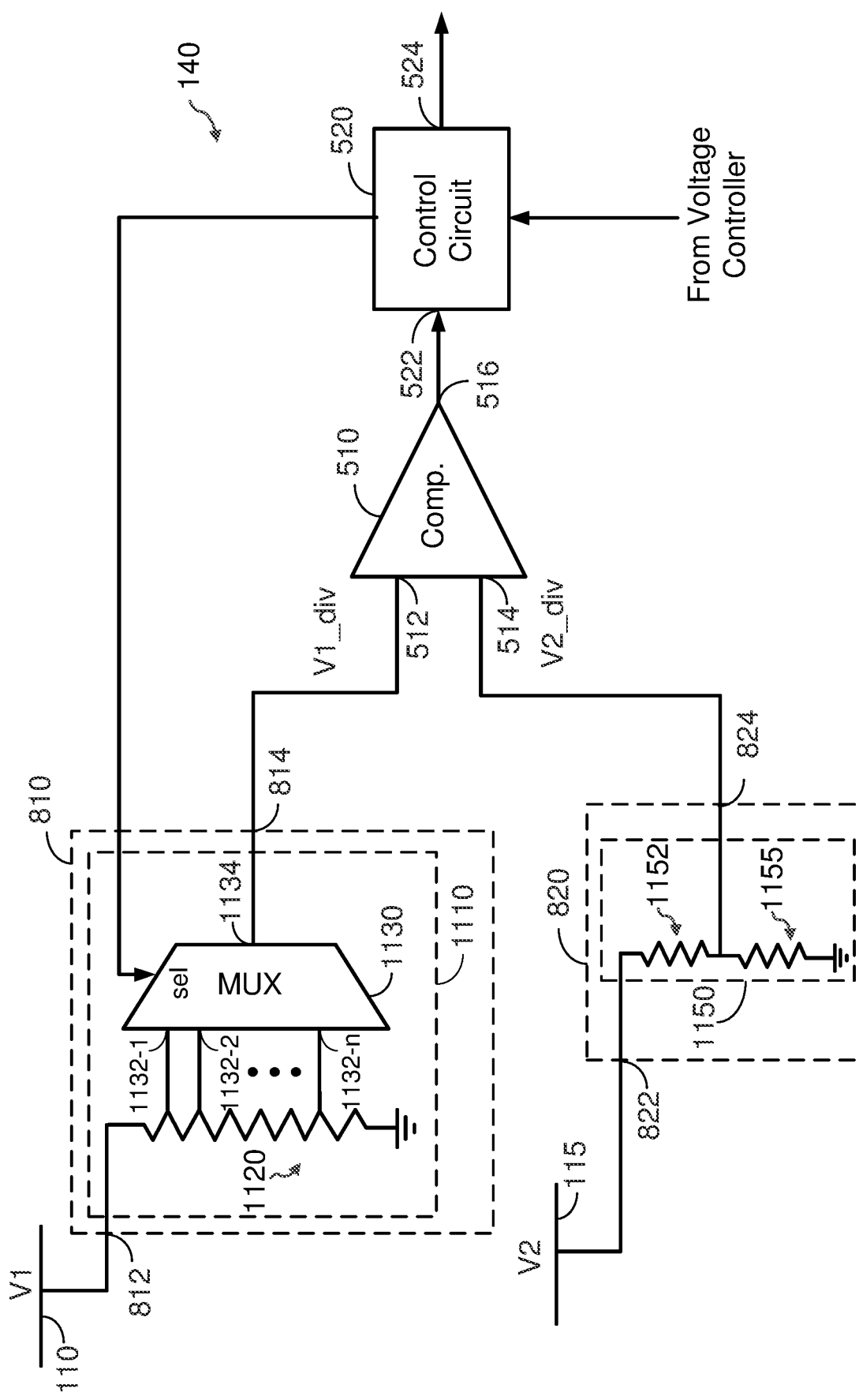
FIG. 11 shows an exemplary implementation of the first voltage divider and the second voltage divider according to certain aspects of the present disclosure.

FIG. 11 shows an exemplary implementation of the first voltage divider 810 and the second voltage divider 820 according to certain aspects. In this example, the first voltage divider 810 includes a programmable voltage divider 1110, and the second voltage divider 820 includes a resistive voltage divider 1150. The control circuit 520 programs the comparator offset by programming the first divider of the first voltage divider 810, as discussed further below.

In this example, the programmable voltage divider 1110 includes a resistor ladder 1120 and a multiplexer 1130. The resistor ladder 1120 is coupled between the input 812 of the first voltage divider 810 and ground. Since the input 812 is coupled to the first power rail 110, the resistor ladder 1120 is coupled between the first power rail 110 and ground. The resistor ladder 1120 may include resistors coupled in series and/or coupled in another configuration.

The multiplexer 1130 has multiple inputs 1132-1 to 1132-n, a select input (labeled "sel"), and an output 1134. Each of the inputs 1132-1 to 1132-n is coupled to a different node on the resistor ladder 1120 corresponding to a different divider value. The output 1134 is coupled to the output 814 of the first voltage divider 810, which is coupled to the first input 512 of the comparator 510. The select input is coupled to the control circuit 520.

The multiplexer 1130 is configured to select one of the inputs 1132-1 to 1132-n based on a control signal (e.g., digital control signal) from the control circuit 520, and couple the selected one of the inputs 1132-1 to 1132-n to the output 814. Since each of the inputs 1132-1 to 1132-n is coupled to a different node on the resistor ladder 1120 corresponding to a different divider value, the control circuit 520 can program the first divider of the first voltage divider 810 by programming which one of the input 1132-1 to 1132-n is selected by the multiplexer 1130. The multiplexer 1130 may be implemented with a network of switches or another type of multiplexer.

In this example, the resistive voltage divider 1150 includes a first resistor 1152 and a second resistor 1155 coupled in series between the input 822 of the second voltage divider 820 and ground. Since the input 822 is coupled to the second power rail 115, the first resistor 1152 and the second resistor 1155 are coupled in series between the second power rail 115 and ground. The output 824 of the second voltage divider 820 is coupled between the first resistor 1152 and the second resistor 1155. In this example, the second divider of the second voltage divider 820 is determined by the resistance the first resistor 1152 and the resistance of the second resistor 1155. For example, when the first resistor 1152 and the second resistor 1155 have equal resistance, the second divider is equal to two, and the second divided voltage (labeled "V2_div") is approximately equal to half the second supply voltage (i.e., V2_div=0.5V2). However, it is to be appreciated that the resistive voltage divider 1150 is not limited to this example.

In this example, the control circuit 520 may program the comparator offset by programming the first divider of the first voltage divider 810 accordingly. For example, the control circuit 520 may program the comparator offset to a positive offset voltage (e.g., for the first mode) by programming the first divider to be greater than the second divider. The control circuit 520 may program the comparator offset to a negative offset voltage (e.g., for the second mode) by programming the first divider to be less than the second divider. In the example in FIG. 11, the control circuit 520 programs the first divider by programming which node on the resistor ladder 1120 is selected by the multiplexer 1130.

In the above example, the control circuit 520 programs the comparator offset by programming the first divider of the first voltage divider 810. However, it is to be appreciated that the present disclosure is not limited to this example. In this regard, FIG. 12 shows an example in which the first voltage divider 810 includes the resistive voltage divider 1150, and the second voltage divider 820 includes the programmable voltage divider 1110.

In this example, the first resistor 1152 and the second resistor 1155 are coupled in series between the input 812 of the first voltage divider 810 and ground, and the output 814 of the first voltage divider 810 is coupled between the first resistor 1152 and the second resistor 1155. In this example, the first divider of the first voltage divider 810 is determined by the resistance the first resistor 1152 and the resistance of the second resistor 1155. For example, when the first resistor 1152 and the second resistor 1155 have equal resistance, the first divider is equal to two, and the first divided voltage (labeled "V1_div") is approximately equal to half the first supply voltage (i.e., V1_div=0.5V1). However, it is to be appreciated that the resistive voltage divider 1150 is not limited to this example.

Figure 12:
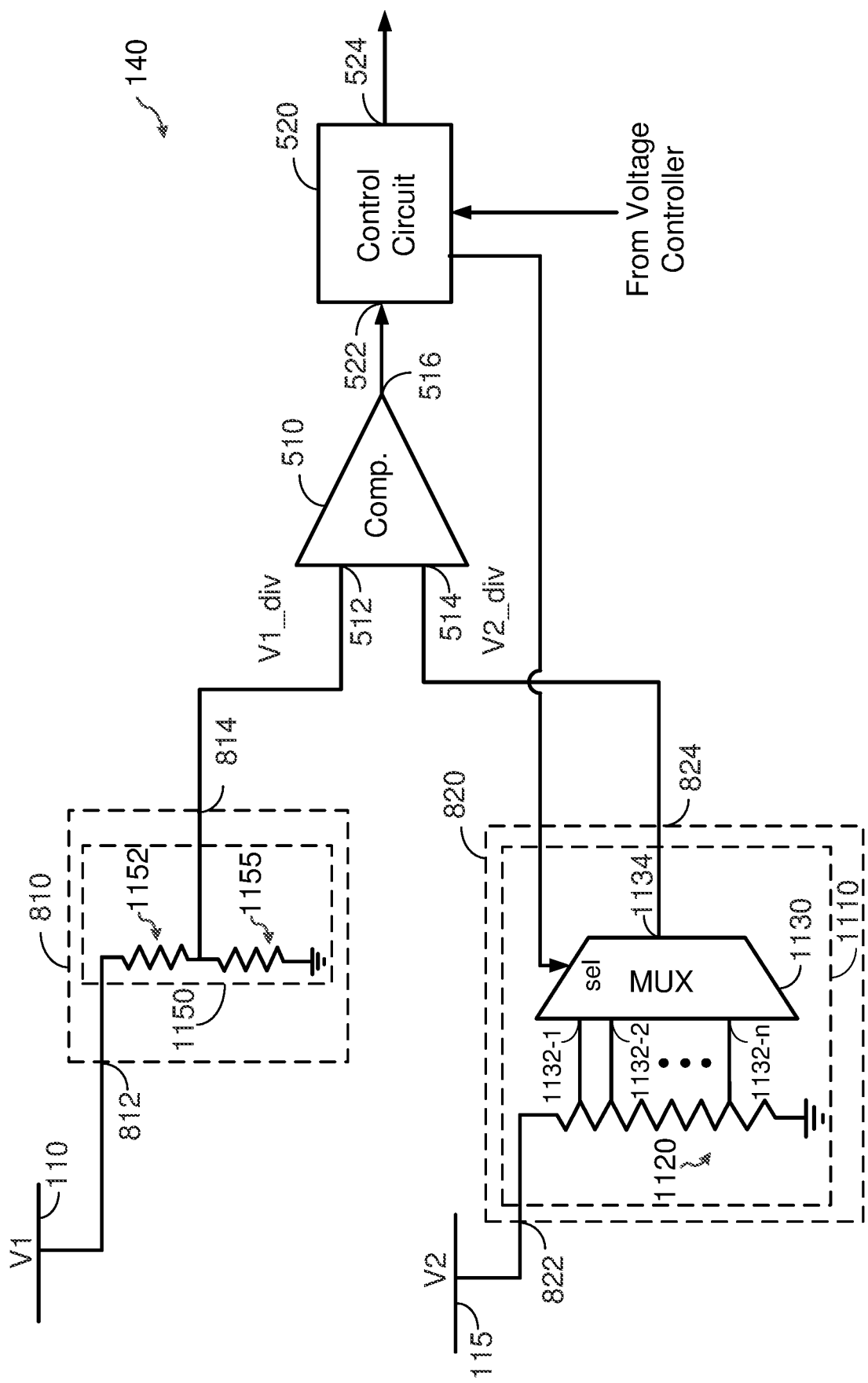
FIG. 12 shows another exemplary implementation of the first voltage divider and the second voltage divider according to certain aspects of the present disclosure.

In the example shown in FIG. 12, the resistor ladder 1120 is coupled between the input 822 of the second voltage divider 820 and ground, and the output 1134 of the multiplexer 1130 is coupled to the output 824 of the second voltage divider 820. The select input of the multiplexer 1130 is coupled to the control circuit 520. As discussed above, each of the inputs 1132-1 to 1132-*n* of the multiplexer 1130 is coupled to a different node on the resistor ladder 1120 corresponding to a different divider value. This allows the control circuit 520 to program the second divider of the second voltage divider 820 by programming which one of the inputs 1132-1 to 1132-*n* is selected by the multiplexer 1130.

In this example, the control circuit 520 may program the comparator offset by programming the second divider of the second voltage divider 820. For example, the control circuit 520 may program the comparator offset to a positive offset voltage (e.g., for the first mode) by programming the second divider to be less than the first divider. The control circuit 520 may program the comparator offset to a negative offset voltage (e.g., for the second mode) by programming the second divider to be greater than the first divider.

Thus, the comparator offset may be programmed by implementing either the first voltage divider 810 or the second voltage divider 820 with a programmable voltage divider. However, it is to be appreciated that the present disclosure is not limited to this example. In this regard, FIG. 13 shows an example in which each of the first voltage divider 810 and the second voltage divider 820 is implemented with a respective programmable voltage divider.

In this example, the first voltage divider 810 includes the programmable voltage divider 1110 discussed above with reference to FIG. 11. In the discussion below, the programmable voltage divider 1110 is referred to as the first programmable voltage divider 1110, the resistor ladder 1120 is referred to as the first resistor ladder, and the multiplexer 1130 is referred to as the first multiplexer.

Figure 13:
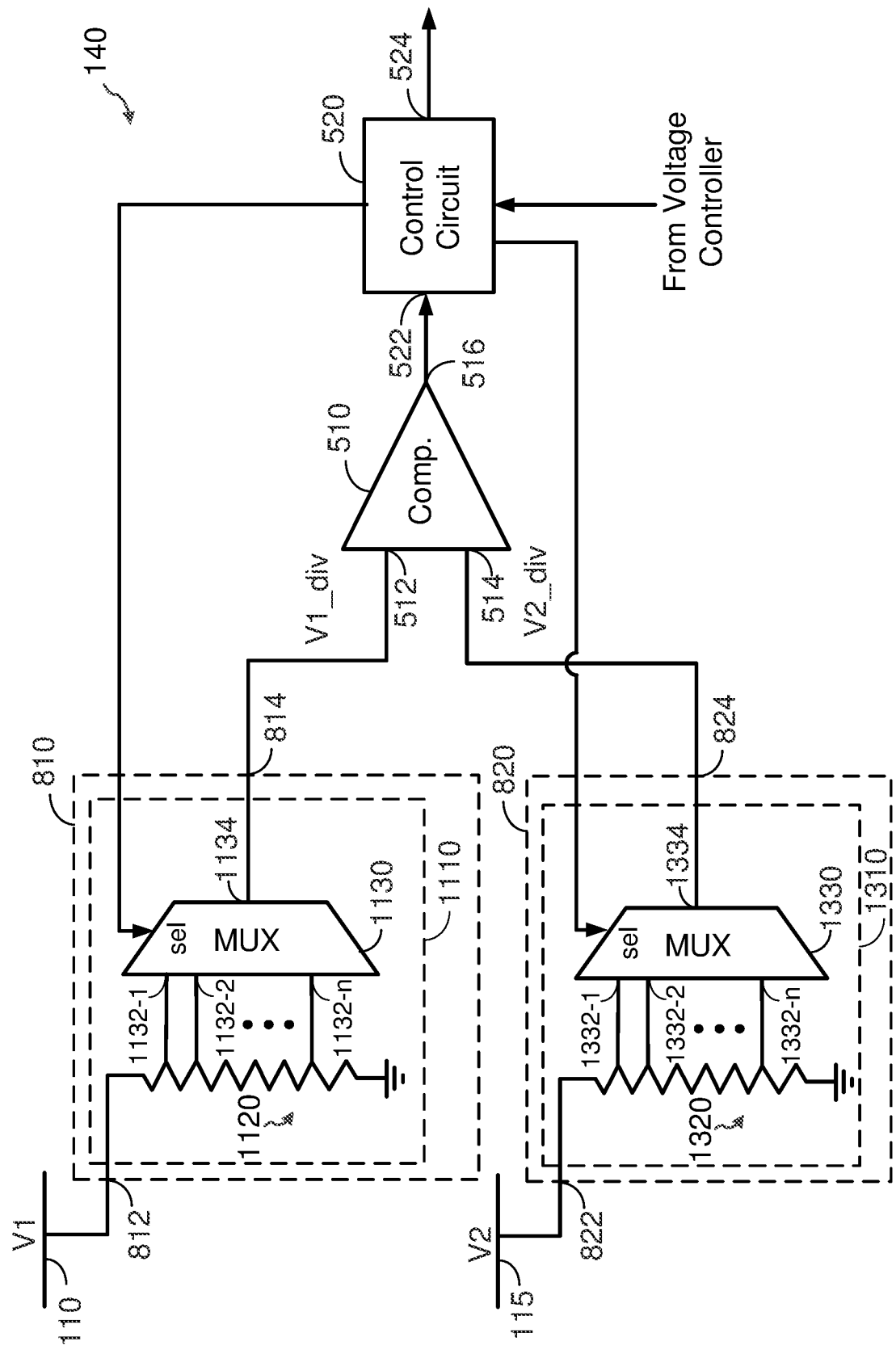
FIG. 13 shows still another exemplary implementation of the first voltage divider and the second voltage divider according to certain aspects of the present disclosure.

In the example in FIG. 13, the second voltage divider 820 includes a second programmable voltage divider 1310. The second programmable voltage divider 1310 may be a second instance of the first programmable voltage divider 1110. The second programmable voltage divider 1310 includes a second resistor ladder 1320 and a second multiplexer 1330.

In this example, the second resistor ladder 1320 is coupled between the input 822 of the second voltage divider 820 and ground. The second multiplexer 1330 has multiple inputs 1332-1 to 1332-*n*, a select input (labeled "sel"), and an output 1334. Each of the inputs 1332-1 to 1332-*n* is coupled to a different node on the second resistor ladder 1320 corresponding to a different divider value. The output 1334 is coupled to the output 824 of the second voltage divider 820, which is coupled to the second input 514 of the comparator 510. The select input is coupled to the control circuit 520.

The second multiplexer 1330 is configured to select one of the inputs 1332-1 to 1332-*n* based on a control signal (e.g., digital control signal) from the control circuit 520, and couple the selected one of the inputs 1332-1 to 1332-*n* to the output 824. Since each of the inputs 1332-1 to 1332-*n* is coupled to a different node on the resistor ladder 1120 corresponding to a different divider value, the control circuit 520 can program the second divider of the second voltage divider 820 by programming which one of the inputs 1332-1 to 1332-*n* is selected by the second multiplexer 1330.

Thus, in this example, the control circuit 520 may program the comparator offset by programming the first divider of the first voltage divider 810 and/or programming the second divider of the second voltage divider 820.

Figure 14:
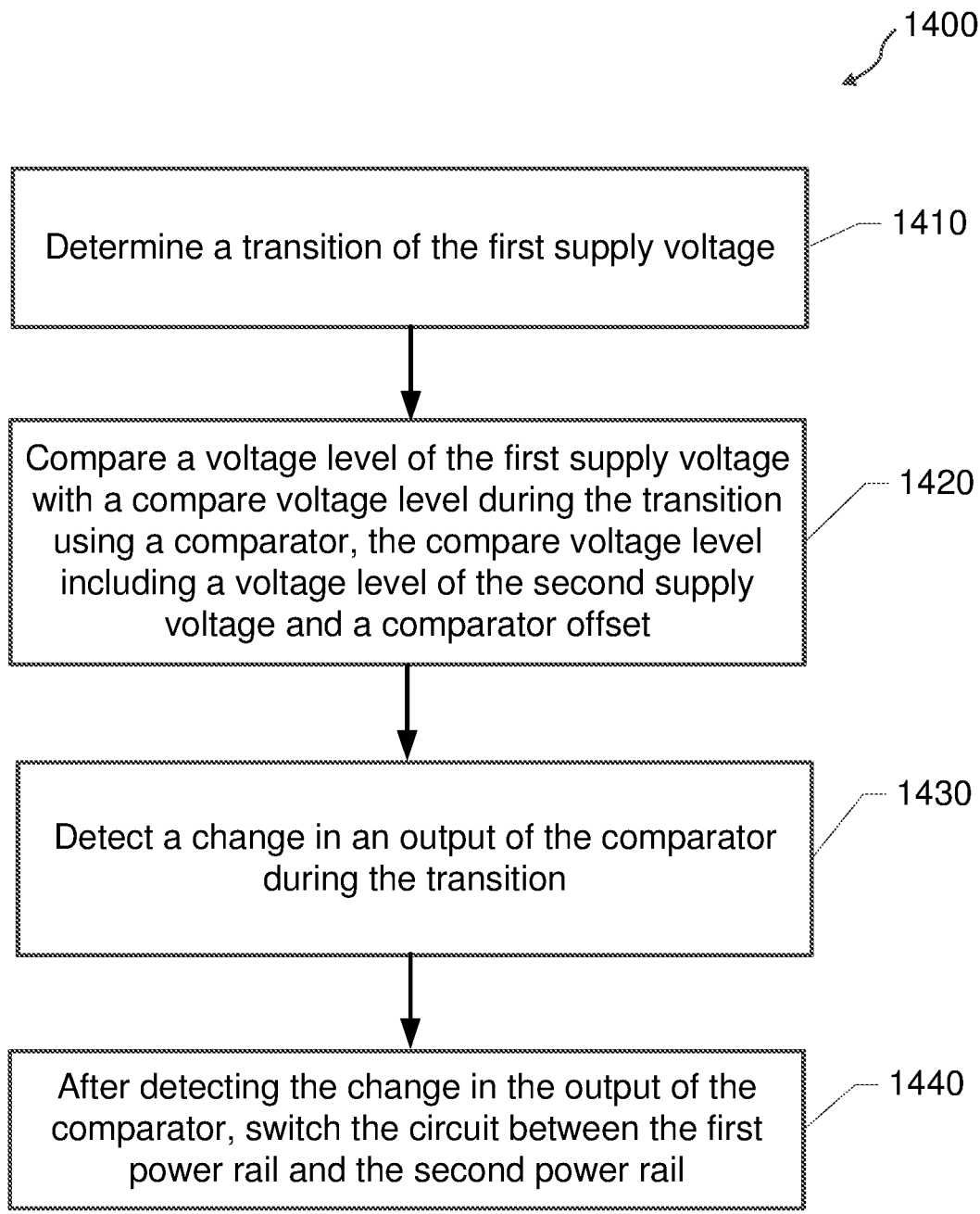
FIG. 14 is a flowchart illustrating a method of power multiplexing according to certain aspects of the present disclosure.

FIG. 14 shows an example of a method 1400 for multiplexing a circuit (e.g., the first circuit 150) between a first power rail (e.g., the first power rail 110) having a first supply voltage and a second power rail (e.g., the second power rail 115) having a second supply voltage. The method 1400 may be performed by the power multiplexer 130 and the multiplexer controller 140.

At block 1410, a transition of the first supply voltage is determined. For example, the determination may be made by the control circuit 520. In this example, the control circuit 520 may receive a signal indicating a target voltage level for the first supply voltage (e.g., from the voltage controller 350), and determine the transition of the first supply voltage based on a starting voltage level and the indicated target voltage level. The control circuit 520 may receive the signal indicating the target voltage level before the transition occurs. The control circuit 520 may determine the starting voltage level based on a previously received signal (e.g., from the voltage controller 350) indicating the starting voltage level.

At block 1420, a voltage level of the first supply voltage is compared with a compare voltage level during the transition using a comparator, the compare voltage including a voltage level of the second supply voltage and a comparator offset. The comparator may correspond to the comparator 510. The comparator offset may be positive or negative.

At block 1430, a change in an output of the comparator is detected during the transition. For example, the control circuit 520 may detect the change in the output of the comparator (e.g., the comparator 510) by detecting a change in the logic value of the compare signal output by the comparator.

At block 1440, after detecting the change in the output of the comparator, the circuit is switched between the first power rail and the second power rail.

In certain aspects, the transition is a downward transition, and the comparator offset includes a positive voltage. In these aspects, switching the circuit between the first power rail and the second power rail may include switching the circuit from the first power rail to the second power rail.

In certain aspects, the first supply voltage crosses the second supply voltage during the transition.

In certain aspects, the transition is an upward transition, and the comparator offset includes a negative voltage. In these aspects, switching the circuit between the first power rail and the second power rail may include switching the circuit from the second power rail to the first power rail.

In certain aspects, the method 1400 may further include comparing a voltage level of the second supply voltage with a threshold voltage level (e.g., the second threshold voltage level), setting the comparator offset to a positive voltage (e.g., protection mode) if the voltage level of the second supply voltage is less than the threshold voltage level, and setting the comparator offset to a negative voltage (e.g., performance mode) if the voltage level of the second supply voltage is greater than the threshold voltage level.

In certain aspects, comparing the voltage level of the first supply voltage with the compare voltage level using the comparator may include dividing the first supply voltage by a first divider to obtain a first divided voltage, dividing the second supply voltage by a second divider to obtain a second divided voltage, wherein the second divider is different from the first divider, and comparing a voltage level of the first divided voltage with a voltage level of the second divided voltage using the comparator. The first supply voltage may be divided using the first voltage divider 810 and the second supply voltage may be divided using the second voltage divider 820.

In certain aspects, the method 1400 may further include receiving a signal indicating the transition before the transition occurs, wherein determining the transition of the first supply voltage comprises determining the transition of the first supply voltage based on the signal. For example, the transition of the first supply voltage may include a transition of the first supply voltage to a target voltage level, and the signal indicating the transition may indicate the target voltage level. In this example, determining the transition of the first supply voltage includes determining the transition of the first supply voltage to the target voltage level based on the signal.

The control circuit 520 may be implemented with a state machine, a processor, a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. A system, comprising:
    a comparator having a first input, a second input, and an output;
    a first voltage divider having an input and an output, wherein the input of the first voltage divider is coupled to a first power rail, and the output of the first voltage divider is coupled to the first input of the comparator;
    a second voltage divider having an input and an output, wherein the input of the second voltage divider is coupled to a second power rail, and the output of the second voltage divider is coupled to the second input of the comparator;
    a power multiplexer coupled to the first power rail, the second power rail, and a first circuit; and
    a control circuit coupled to the output of the comparator and the power multiplexer.

2. The system of clause 1, wherein the first voltage divider comprises a programmable voltage divider.

3. The system of clause 2, wherein the programmable voltage divider comprises:
    a resistor ladder coupled between the input of the first voltage divider and a ground; and
    a multiplexer having inputs and an output, wherein each of the inputs of the multiplexer is coupled to a respective node on the resistor ladder, and the output of the multiplexer is coupled to the output of the first voltage divider.

4. The system of clause 3, wherein the multiplexer has a select input coupled to the control circuit.

5. The system of any one of clauses 2 to 4, wherein the second voltage divider comprises a resistive voltage divider.

6. The system of clause 1, wherein the first voltage divider comprises a first programmable voltage divider, and the second voltage divider comprises a second programmable voltage divider.

7. The system of any one of clauses 1 to 6, further comprising a second circuit coupled to the first power rail.

8. The system of clause 7, wherein the first circuit comprises a memory, and the second circuit comprises a processor coupled to the memory.

9. The system of any one of clauses 1 to 8, wherein:
    the first voltage divider is configured to divide a first supply voltage from the first power rail by a first divider to generate a first divided voltage, and output the first divided voltage at the output of the first voltage divider;
    the second voltage divider is configured to divide a second supply voltage from the second power rail by a second divider to generate a second divided voltage, and output the second divided voltage at the output of the second voltage divider; and
    the first divider is different from the second divider.

10. The system of clause 9, wherein the control circuit is configured to:
    compare a voltage level of the second supply voltage with a threshold voltage level;
    set the first divider greater than the second divider if the voltage level of the second supply voltage is less than the threshold voltage level; and
    set the first divider less than the second divider if the voltage level of the second supply voltage is greater than the threshold voltage level.

11. The system of any one of clauses 1 to 8, wherein the control circuit is configured to:
    receive a signal indicating a target voltage level for a first supply voltage on the first power rail;
    determine the target voltage level is less than a threshold voltage level;
    after determining the target voltage level is less than the threshold voltage level, detect a change in the output of the comparator; and
    after detecting the change in the output of the comparator, cause the power multiplexer to switch the first circuit from the first power rail to the second power rail.

12. The system of clause 11, wherein a voltage level of a second supply voltage on the second power rail is greater than the threshold voltage level.

13. The system of clause 11 or 12, wherein:
    the first voltage divider is configured to divide the first supply voltage by a first divider to generate a first divided voltage, and output the first divided voltage at the output of the first voltage divider;
    the second voltage divider is configured to divide a second supply voltage on the second power rail by a second divider to generate a second divided voltage, and output the second divided voltage at the output of the second voltage divider; and the first divider is different from the second divider.

14. The system of clause 13, wherein the first divider is greater than the second divider.

15. The system of any one of clauses 11 to 14, wherein the control circuit is configured to receive the signal indicating the target voltage level before a transition of the first supply voltage to the target voltage level occurs, and detect the change in the output of the comparator during the transition.

16. The system of any one of clauses 1 to 8, wherein the control circuit is configured to:
    receive a signal indicating a target voltage level for a first supply voltage on the first power rail;
    determine the target voltage level is greater than a threshold voltage level;
    after determining the target voltage level is greater than the threshold voltage level, detect a change in the output of the comparator; and
    after detecting the change in the output of the comparator, cause the power multiplexer to switch the first circuit from the second power rail to the first power rail.

17. The system of clause 16, wherein:
    the first voltage divider is configured to divide the first supply voltage by a first divider to generate a first divided voltage, and output the first divided voltage at the output of the first voltage divider;

the second voltage divider is configured to divide a second supply voltage on the second power rail by a second divider to generate a second divided voltage, and output the second divided voltage at the output of the second voltage divider; and the first divider is different from the second divider.

18. The system of clause 17, wherein the first divider is less than the second divider.

19. The system of any one of clauses 16 to 18, wherein the control circuit is configured to receive the signal indicating the target voltage level before a transition of the first supply voltage to the target voltage level occurs, and detect the change in the output of the comparator during the transition.

20. A method for multiplexing a circuit between a first power rail having a first supply voltage and a second power rail having a second supply voltage, the method comprising:
  determining a transition of the first supply voltage;
  comparing a voltage level of the first supply voltage with a compare voltage level during the transition using a comparator, the compare voltage including a voltage level of the second supply voltage and a comparator offset;
  detecting a change in an output of the comparator during the transition; and
  after detecting the change in the output of the comparator, switching the circuit between the first power rail and the second power rail.

21. The method of clause 20, wherein the first supply voltage crosses the second supply voltage during the transition.

22. The method of clause 20 or 21, wherein the transition is a downward transition, and the comparator offset comprises a positive voltage.

23. The method of clause 22, wherein switching the circuit between the first power rail and the second power rail comprises switching the circuit from the first power rail to the second power rail.

24. The method of clause 20 or 21, wherein the transition is an upward transition, and the comparator offset comprises a negative voltage.

25. The method of clause 24, wherein switching the circuit between the first power rail and the second power rail comprises switching the circuit from the second power rail to the first power rail.

26. The method of any one of clauses 20 to 25, further comprising:
  comparing a voltage level of the second supply voltage with a threshold voltage level;
  setting the comparator offset to a positive voltage if the voltage level of the second supply voltage is less than the threshold voltage level; and
  setting the comparator offset to a negative voltage if the voltage level of the second supply voltage is greater than the threshold voltage level.

27. The method of any one of clauses 20 to 26, wherein comparing the voltage level of the first supply voltage with the compare voltage level using the comparator comprises:
  dividing the first supply voltage by a first divider to obtain a first divided voltage;
  dividing the second supply voltage by a second divider to obtain a second divided voltage, wherein the second divider is different from the first divider; and
  comparing a voltage level of the first divided voltage with a voltage level of the second divided voltage using the comparator.

28. The method of any one of clauses 20 to 27, further comprising receiving a signal indicating the transition before the transition occurs, wherein determining the transition of the first supply voltage comprises determining the transition of the first supply voltage based on the signal.

29. The method of clause 28, wherein:
  the transition of the first supply voltage comprises a transition of the first supply voltage to a target voltage level;
  the signal indicating the transition indicates the target voltage level; and
  determining the transition of the first supply voltage comprises determining the transition of the first supply voltage to the target voltage level based on the signal.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. As used herein, "approximately" means within 10 percent of the stated value (i.e., within a range between 90 percent of the stated value and 110 percent of the stated value).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
  a comparator having a first input, a second input, and an output;
  a first voltage divider having an input and an output, wherein the input of the first voltage divider is coupled to a first power rail, and the output of the first voltage divider is coupled to the first input of the comparator;
  a second voltage divider having an input and an output, wherein the input of the second voltage divider is coupled to a second power rail, and the output of the second voltage divider is coupled to the second input of the comparator;
  a power multiplexer coupled to the first power rail, the second power rail, and a first circuit; and
  a control circuit coupled to the output of the comparator and the power multiplexer, wherein
  the first voltage divider is configured to divide a first supply voltage from the first power rail by a first divider to generate a first divided voltage, and output the first divided voltage at the output of the first voltage divider;

the second voltage divider is configured to divide a second supply voltage from the second power rail by a second divider to generate a second divided voltage, and output the second divided voltage at the output of the second voltage divider;

the first divider is different from the second divider; and the control circuit is configured to compare a voltage level of the second supply voltage with a threshold voltage level, set the first divider greater than the second divider if the voltage level of the second supply voltage is less than the threshold voltage level, and set the first divider less than the second divider if the voltage level of the second supply voltage is greater than the threshold voltage level.

2. The system of claim 1, wherein the first voltage divider comprises a programmable voltage divider.

3. The system of claim 2, wherein the programmable voltage divider comprises:

a resistor ladder coupled between the input of the first voltage divider and a ground; and a multiplexer having inputs and an output, wherein each of the inputs of the multiplexer is coupled to a respective node on the resistor ladder, and the output of the multiplexer is coupled to the output of the first voltage divider.

4. The system of claim 3, wherein the multiplexer has a select input coupled to the control circuit.

5. The system of claim 2, wherein the second voltage divider comprises a resistive voltage divider.

6. The system of claim 1, wherein the first voltage divider comprises a first programmable voltage divider, and the second voltage divider comprises a second programmable voltage divider.

7. The system of claim 1, further comprising a second circuit coupled to the first power rail.

8. The system of claim 7, wherein the first circuit comprises a memory, and the second circuit comprises a processor coupled to the memory.

9. The system of claim 1, wherein the control circuit is configured to:

receive a signal indicating a target voltage level for a first supply voltage on the first power rail;

determine the target voltage level is less than a threshold voltage level;

after determining the target voltage level is less than the threshold voltage level, detect a change in the output of the comparator; and after detecting the change in the output of the comparator, cause the power multiplexer to switch the first circuit from the first power rail to the second power rail.

10. The system of claim 9, wherein a voltage level of a second supply voltage on the second power rail is greater than the threshold voltage level.

11. The system of claim 9, wherein:

the first voltage divider is configured to divide the first supply voltage by a first divider to generate a first divided voltage, and output the first divided voltage at the output of the first voltage divider;

the second voltage divider is configured to divide a second supply voltage on the second power rail by a second divider to generate a second divided voltage, and output the second divided voltage at the output of the second voltage divider; and the first divider is different from the second divider.

12. The system of claim 11, wherein the first divider is greater than the second divider.

13. The system of claim 9, wherein the control circuit is configured to receive the signal indicating the target voltage level before a transition of the first supply voltage to the target voltage level occurs, and detect the change in the output of the comparator during the transition.

14. The system of claim 1, wherein the control circuit is configured to:

receive a signal indicating a target voltage level for a first supply voltage on the first power rail;

determine the target voltage level is greater than a threshold voltage level;

after determining the target voltage level is greater than the threshold voltage level, detect a change in the output of the comparator; and after detecting the change in the output of the comparator, cause the power multiplexer to switch the first circuit from the second power rail to the first power rail.

15. The system of claim 14, wherein:

the first voltage divider is configured to divide the first supply voltage by a first divider to generate a first divided voltage, and output the first divided voltage at the output of the first voltage divider;

the second voltage divider is configured to divide a second supply voltage on the second power rail by a second divider to generate a second divided voltage, and output the second divided voltage at the output of the second voltage divider; and the first divider is different from the second divider.

16. The system of claim 15, wherein the first divider is less than the second divider.

17. The system of claim 14, wherein the control circuit is configured to receive the signal indicating the target voltage level before a transition of the first supply voltage to the target voltage level occurs, and detect the change in the output of the comparator during the transition.

18. A method for multiplexing a circuit between a first power rail having a first supply voltage and a second power rail having a second supply voltage, the method comprising:

determining a transition of the first supply voltage;

comparing a voltage level of the first supply voltage with a compare voltage level during the transition using a comparator, the compare voltage including a voltage level of the second supply voltage and a comparator offset;

detecting a change in an output of the comparator during the transition;

after detecting the change in the output of the comparator, switching the circuit between the first power rail and the second power rail;

comparing a voltage level of the second supply voltage with a threshold voltage level;

setting the comparator offset to a positive voltage if the voltage level of the second supply voltage is less than the threshold voltage level; and setting the comparator offset to a negative voltage if the voltage level of the second supply voltage is greater than the threshold voltage level.

19. The method of claim 18, wherein the first supply voltage crosses the second supply voltage during the transition.

20. The method of claim 18, wherein the transition is a downward transition, and the comparator offset comprises a positive voltage.

21. The method of claim 20, wherein switching the circuit between the first power rail and the second power rail comprises switching the circuit from the first power rail to the second power rail.

22. The method of claim 18, wherein the transition is an upward transition, and the comparator offset comprises a negative voltage.

23. The method of claim 22, wherein switching the circuit between the first power rail and the second power rail comprises switching the circuit from the second power rail to the first power rail.

24. The method of claim 18, wherein comparing the voltage level of the first supply voltage with the compare voltage level using the comparator comprises:
dividing the first supply voltage by a first divider to obtain a first divided voltage;
dividing the second supply voltage by a second divider to obtain a second divided voltage, wherein the second divider is different from the first divider; and
comparing a voltage level of the first divided voltage with a voltage level of the second divided voltage using the comparator.

25. The method of claim 18, further comprising receiving a signal indicating the transition before the transition occurs, wherein determining the transition of the first supply voltage comprises determining the transition of the first supply voltage based on the signal.

26. The method of claim 25, wherein:
the transition of the first supply voltage comprises a transition of the first supply voltage to a target voltage level;
the signal indicating the transition indicates the target voltage level; and
determining the transition of the first supply voltage comprises determining the transition of the first supply voltage to the target voltage level based on the signal.

* * * * *